United States Patent
Tsunoda et al.

(10) Patent No.: US 8,138,818 B2
(45) Date of Patent: Mar. 20, 2012

(54) GATE DRIVE APPARATUS

(75) Inventors: Yoshikazu Tsunoda, Tokyo (JP); Tatsuya Okuda, Tokyo (JP); Masaru Fuku, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 455 days.

(21) Appl. No.: 12/144,871

(22) Filed: Jun. 24, 2008

(65) Prior Publication Data
US 2009/0002054 A1   Jan. 1, 2009

(30) Foreign Application Priority Data
Jun. 27, 2007   (JP) .................................. 2007-168849

(51) Int. Cl.
*H03K 17/04* (2006.01)

(52) U.S. Cl. ........ 327/374; 327/108; 327/427; 327/434; 327/403

(58) Field of Classification Search .......... 327/108–112, 327/374–377, 380, 381, 403–405, 427, 429, 327/434
See application file for complete search history.

(56) References Cited

U.S. PATENT DOCUMENTS

| | | | |
|---|---|---|---|
| 4,177,416 A | 12/1979 | Davis | |
| 5,381,083 A | 1/1995 | Inamori et al. | |
| 5,798,663 A * | 8/1998 | Fugere et al. | 327/205 |
| 6,804,091 B2 * | 10/2004 | Jenkins et al. | 361/18 |
| 2002/0070772 A1 | 6/2002 | Neacsu et al. | |
| 2005/0017788 A1 | 1/2005 | Inoue | |
| 2005/0052224 A1 | 3/2005 | Yang et al. | |
| 2007/0040542 A1 | 2/2007 | Cortigiani et al. | |
| 2008/0231219 A1 * | 9/2008 | Mori et al. | 318/434 |

FOREIGN PATENT DOCUMENTS

| | | |
|---|---|---|
| EP | 0 817 381 | 1/1998 |
| JP | 8-33315 A | 2/1996 |
| JP | 2000-253646 | * 9/2000 |
| JP | 3680722 | * 5/2005 |
| JP | 36800722 B2 | 5/2005 |

OTHER PUBLICATIONS

European Search Report issued in the corresponding Application No. 08159117.4-1233 dated Jan. 30, 2009.

* cited by examiner

*Primary Examiner* — Lincoln Donovan
*Assistant Examiner* — Shikha Goyal
(74) *Attorney, Agent, or Firm* — Buchanan Ingersoll & Rooney PC

(57) ABSTRACT

A gate drive apparatus including a constant-current-pulse gate drive circuit which creates a gate signal for a switching device as a constant-current output, a constant-voltage-pulse gate drive circuit which creates the gate signal as a constant-voltage output, and a decision/switch circuit which switches the operation of the constant-current-pulse gate drive circuit and the operation of the constant-voltage-pulse gate drive circuit. The variance of switching speeds attributed to the variances of threshold voltages and mirror voltages in a plurality of switching devices which are driven by the gate drive apparatus can be suppressed, and the variance of losses can be minimized.

20 Claims, 19 Drawing Sheets

VARIANCE OF Vmirror→ VARIANCE OF CHARGING CURRENT→
VARIANCE OF CHARGING TIME→ VARIANCE OF SWITCHING ON LOSS

GATE DRIVE APPARATUS

BACKGROUND OF THE INVENTION

1. Field of the Invention

This invention relates to a gate drive circuit for use in a switching device of voltage drive type, such as IGBT or FET.

2. Description of the Background Art

In a conventional switching device, its gate is driven through a gate resistance by a drive IC or a drive circuit connected to a gate power source (refer to, for example, Patent Document 1).

Patent Document 1: JP-A-8-33315 (Sectors [0008] to [0011] and FIG. 6)

Such a prior-art gate drive apparatus has had the problem that a time in which the switching device shifts from OFF to ON varies greatly, depending upon the individual characteristics of elements.

Now, the variance of the ON shift time in a turn-ON period will be explained in detail by taking an IGBT as an example and together with the operation thereof, in conjunction with FIGS. 27 and 28. Incidentally, it is assumed that a load L is an inductive load, and that a current I (A) is flywheeled by the load and a diode. FIG. 27 is a diagram of the circuit arrangement of the gate drive apparatus, while FIG. 28 is a diagram for explaining the operation thereof.

When a command of ON is given by a control signal (gate control signal), a gate drive IC applies the control voltage VDD of a control power source to the gate (G) of an IGBT 1 through a gate resistance Rg and charges a gate input capacitance Cge. On this occasion, the IGBT 1 remains OFF before a gate voltage arrives at a gate threshold voltage (Vth) ([1] in FIG. 28).

When, beyond the threshold voltage Vth, a current begins to flow through the C-E path of the IGBT 1 and the gate voltage becomes a mirror voltage Vmirror, the collector current Ic of the IGBT 1 becomes the current I (A) (a period [1] to [2] in FIG. 28).

A time period in which the current turns from OFF to ON, corresponds to a time period in which the gate voltage exceeds the threshold voltage Vth and becomes the mirror voltage Vmirror, and it is expressed by the following formula:

$$t_{I\text{-}ON} = -CR\ln(1 - V\text{mirror}/VDD) - \{-CR\ln(1 - Vth/VDD)\}$$

Here, variances are involved in the mirror voltage Vmirror and the threshold voltage Vth, depending upon the individual characteristics. In, for example, the IGBT of high mirror voltage, the above time period becomes long in exponential fashion, that is, switching becomes slow ([2]' in FIG. 28).

When the charging is further continued after the gate voltage has become the mirror voltage, the voltage Vce of the IGBT 1 shifts into an ON state (a period [2] to [3] in FIG. 28).

A time period in the meantime is expressed by the following equation, by using mirror charges (Qgc) stored in a feedback capacitance (Cgc):

$$t_{V\text{-}ON} = Qgc \times Rg/(VDD - V\text{mirror})$$

In addition, a charging current Ig to the gate in the meantime is expressed by the following equation:

$$Ig = \Delta V/Rg = (VDD - V\text{mirror})/Rg$$

Therefore, as the mirror voltage is higher, the time period of the voltage Vce till the ON shift becomes longer (a period [2]' to [3]' in FIG. 28).

Besides, the charging by the mirror voltage is further required until the voltage Vce thereafter shifts completely into the ON state, and a period therefor depends upon the current Ig (a time point [4] or [4]' in FIG. 28).

Incidentally, the mirror voltage is determined by the gate threshold voltage Vth, current amplification factor gm and output current Ic of the IGBT 1 and depends greatly upon the voltage Vth, as indicated by the following formula:

$$V\text{mirror} = Vth + \sqrt{(Ic/gm)}$$

Accordingly, the variance of the voltage Vth becomes the variance of the CR charging time and becomes the variance of the Ic ON-shift time ($t_{I\text{-}ON}$). Besides, the variances of the voltage Vth and the factor gm become that variance of the mirror voltage, which causes the variance of the charging current and causes the variance of the charging time, so that the Vce ON-shift time ($t_{V\text{-}ON}$) varies.

The relationship between an ON shift time ($t_{ON} = t_{I\text{-}ON} + t_{V\text{-}ON}$) and a loss is expressed by the following formula:

$$P\text{loss (on)} = 1/2 \times Ic \times Vce \times t_{I\text{-}ON} \times f + 1/2 \times Ic \times Vce \times t_{V\text{-}ON} \times f = 1/2 \times Ic \times Vce \times t_{ON} \times f$$

Here, Vce: the voltage Vce in a steady state, Ic: the collector current after turn-ON, and f: a switching frequency.

As stated above, both the variance of the Ic ON-shift time and the variance of the Vce ON-shift time become the variance of the switching loss.

Incidentally, the influence of the variance can be lessened by making the gate resistance value Rg smaller. In an IGBT which is actually used, however, it is generally indicated that the connection of a gate resistance is indispensable so as to prevent a switching speed from rising excessively. Besides, as an EMI countermeasure, it is a general disposal to limit "dV/dt" and "dI/dt" at the time of switching.

In the prior art, therefore, the least value of the ON shift time $t_{ON}$ is designed under the condition of the least mirror voltage, and the gate resistance at a switching speed (max) is determined. In addition, the switching speed at the greatest mirror voltage is calculated under the condition under which the gate resistance has been determined, and the switching loss must be designed on the basis of the corresponding time period. Accordingly, the variance of the loss attributed to the variance of the mirror voltage tends to become large. Incidentally, the situation of an OFF shift is the same, and a similar problem is posed.

SUMMARY OF THE INVENTION

This invention has been made in order to solve the problems as stated above, and it has for its object to obtain a gate drive apparatus which can suppress the variance of switching speeds attributed to the variances of threshold voltages and mirror voltages in a plurality of switching devices to be driven by the gate drive apparatus, and which can minimize the variance of losses.

A gate drive apparatus according to this invention concerns a gate drive apparatus which is connected to a gate of a switching device of voltage drive type, and which outputs to the gate, gate signals that turn ON/OFF the switching device on the basis of ON/OFF gate control signals.

A gate drive apparatus for either or both of the turn-ON operation and the turn-OFF operation includes a constant-current-pulse gate drive circuit which creates the gate signal as a constant-current output, a constant-voltage-pulse gate drive circuit which creates the gate signal as a constant-voltage output, and a decision switch circuit which switches the operation of the constant-current-pulse gate drive circuit and the operation of the constant-voltage-pulse gate drive circuit.

This invention brings forth remarkable advantages not existing in the prior art, as follows: A shift period in a gate drive mode is driven by the constant-current output, whereby the variance of the shift period attributed to the variances of a gate threshold voltage and a mirror voltage in the switching device can be minimized, and the variances of a switching speed and a switching loss can be sharply suppressed. Further, in the switching device of voltage drive type having a gate structure of MOS type, constant-current drive is switched to constant-voltage drive, whereby the switching device can be driven without spoiling the reliability of the gate oxide film thereof.

The foregoing and other objects, features, aspects and advantages of the present invention will become more apparent from the following detailed description when read in conjunction with the accompanying drawings.

DETAILED DESCRIPTION OF THE PREFERRED EMBODIMENTS OF THE INVENTION

First Embodiment

Figure 1:
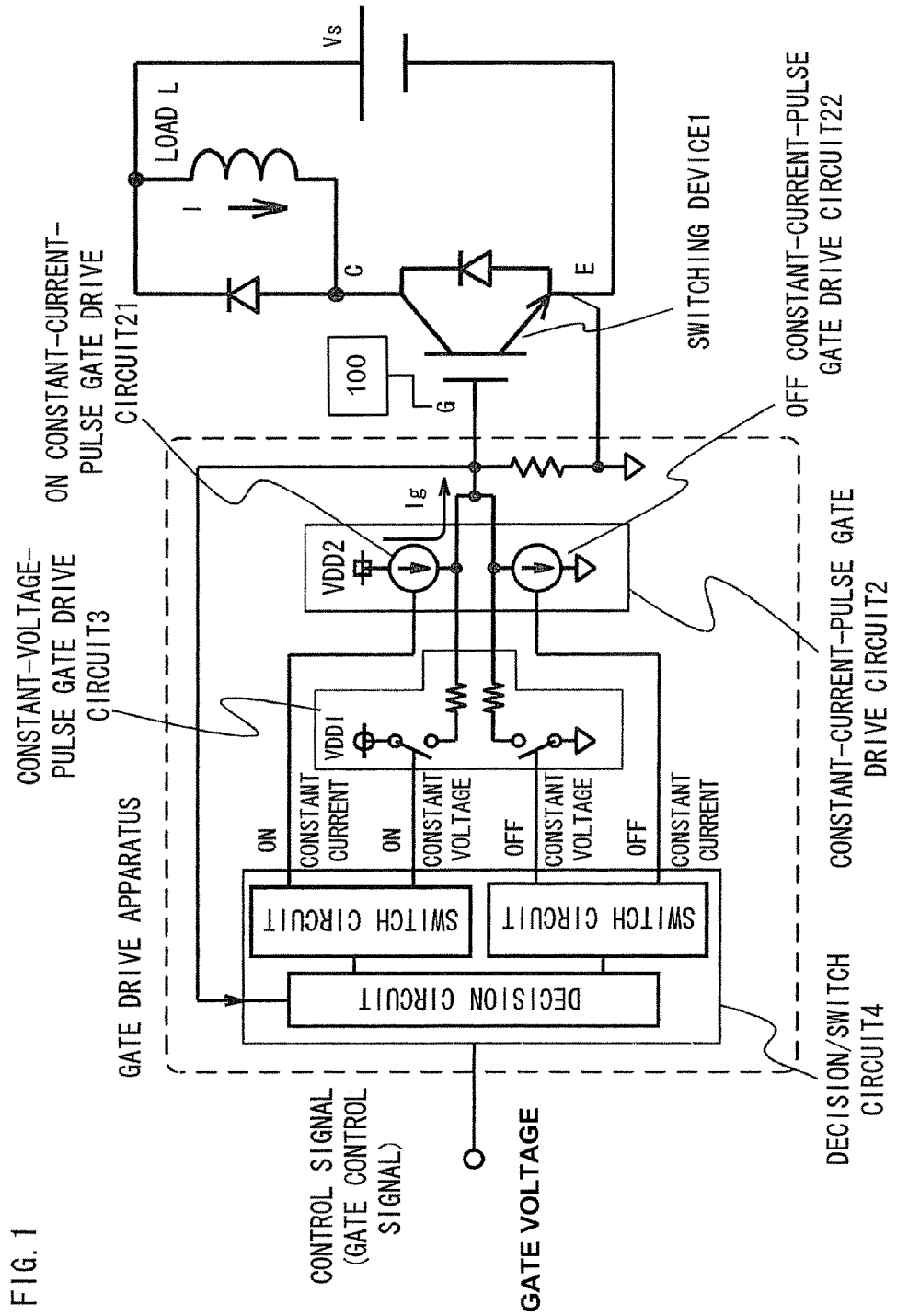
FIG. 1 is a general configurational diagram of a gate drive apparatus according to Embodiment 1 of the present invention.

FIG. 1 is a general configurational diagram of a gate drive apparatus according to Embodiment 1 of the present invention. The output of a constant-current-pulse gate drive circuit 2 is connected to the gate of a switching device (IGBT) 1, and the output of a constant-voltage-pulse gate drive circuit 3 is further connected thereto.

A decision/switch circuit 4 receives, as inputs, a control signal (gate control signal) and the gate voltage of the switching device 1 via a gate voltage detection circuit 100. The decision/switch circuit 4 outputs and connects the control signal of ON constant current/OFF constant current to the constant-current-pulse gate drive circuit 2, and the control signal of ON constant voltage/OFF constant voltage to the constant-voltage-pulse gate drive circuit 3.

Here, the voltage VDD2 of a control power source used for the constant-current-pulse gate drive circuit 2 is set higher than the voltage VDD1 of a control power source for the constant-voltage-pulse gate drive circuit 3. This is because the variance of constant-current set values attributed to the individual variances of components (semiconductor devices) for use in the constant-current-pulse gate drive circuit 2 is suppressed as will be detailed later.

Figure 2:
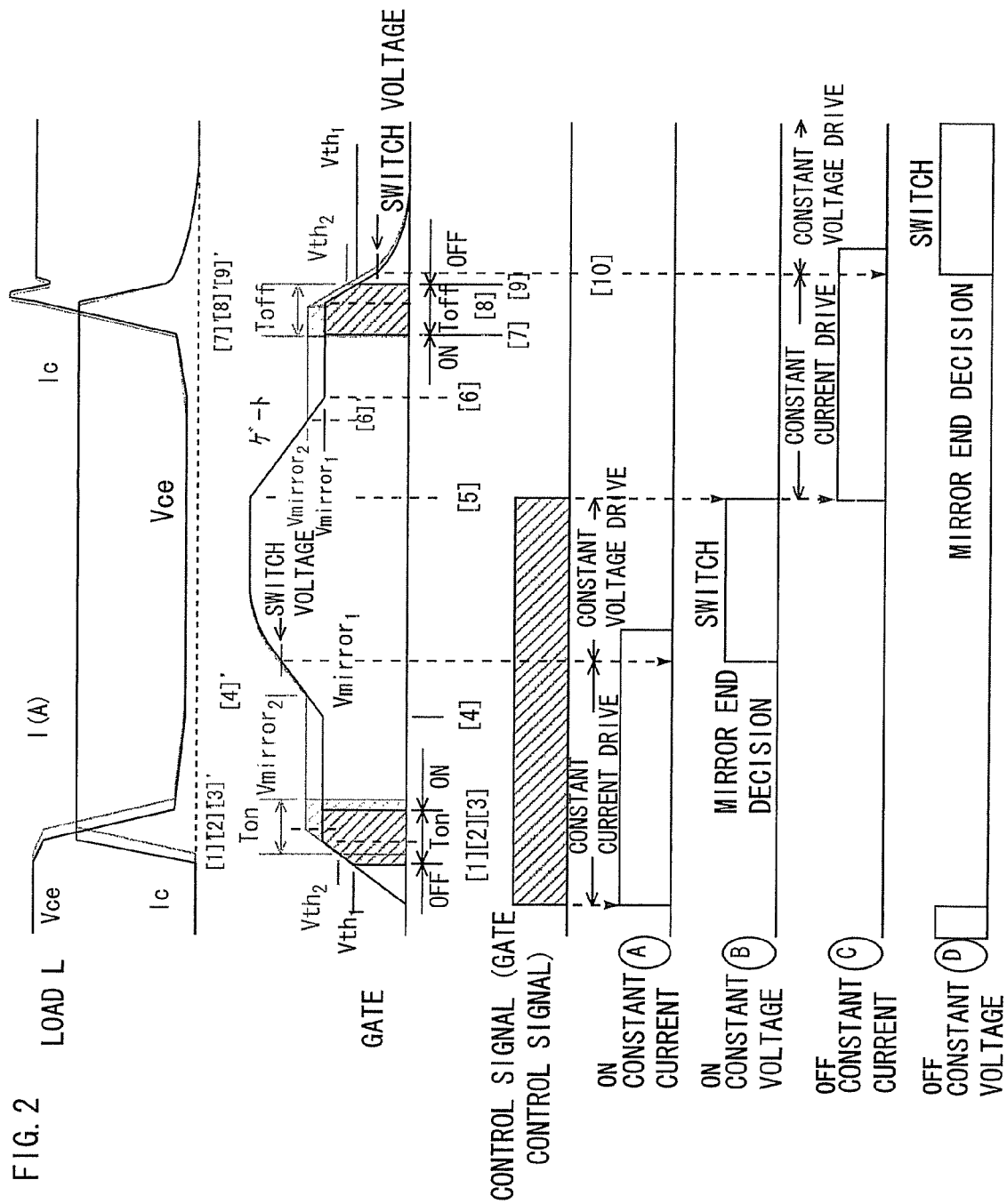
FIG. 2 is a waveform diagram for explaining the operation of the gate drive apparatus according to Embodiment 1.

Next, an operation will be described by exemplifying a case where an inductive load L is driven by a circuit arrangement which uses the gate drive apparatus in FIG. 1. FIG. 2 shows a chart of the control signal, gate voltage waveforms, and the collector current Ic and collector-emitter voltage Vce of the IGBT in this arrangement. Incidentally, it is assumed that the inductive load L is flywheeled by a closed circuit consisting of this load and a diode, with a current I (A).

In FIG. 2, considering the variance of the mirror voltages Vmirror, the operation a product whose mirror voltage is Vmirror1 is shown in black, and the operation a product whose mirror voltage is Vmirror2 is shown in gray.

Now, an ON operation (turn-ON operation), accordingly an operation in which "H" (a "high" level) is inputted as the control signal until the IGBT 1 is turned ON, will be described in detail.

When the "H" is inputted as the control signal, the control signal of the ON constant current is outputted in accordance with the decision of the decision/switch circuit 4. Thus, an ON constant-current-pulse gate drive circuit 21 operates, and a constant current Ig is supplied to the gate of the switching device 1 so as to perform constant current charging for the gate input capacitance Cge of this switching device.

On this occasion, before a gate voltage arrives at a gate threshold voltage (Vth), the IGBT 1 remains OFF (a time point [1] or [1]' in FIG. 2). When, beyond the voltage Vth, a current begins to flow through the C-E path of the IGBT 1 and the gate voltage becomes the mirror voltage, the collector current Ic of the IGBT 1 becomes the current I (A) (a period [1] to [2], or [1]' to [2]' in FIG. 2).

Incidentally, it is assumed here that the gate threshold voltage Vth is a gate voltage at the time when a current of 0.01% as a ratio to the rated current of the switching element flows through the switching element.

In case of the prior-art "constant voltage-resistance" drive through a resistance, a time period in which the above current turns from OFF to ON is expressed as follows by reducing the formula already mentioned, and it depends upon the voltages VDD and Vth:

$$t_{r\_ON\ prior\ art} = -Cge \cdot Rg \cdot \ln\{1 - 1/(VDD - Vth) \cdot \sqrt{(Ic/gm)}\}$$

In contrast, when the gate of the IGBT 1 is driven with the constant current as shown in FIG. 1, a time period in which the current turns from OFF to ON is expressed by the following formula, and it becomes independent of the voltage VDD or Vth:

$$t_{r\_ON} = Cge \cdot 1/Ig \cdot q\sqrt{(Ic/gm)}$$

Thus, it is permitted to eliminate the variance of the time period $t_{r\_ON}$.

When the charging is further continued after the arrival of the gate voltage at the mirror voltage, the voltage Vce of the IGBT 1 is shifted to ON (a period [2] to [4], or [2]' to [4]' in FIG. 2).

In the prior-art "constant voltage-resistance" drive, the charging current Ig for the gate after the mirror voltage is expressed by:

$$Ig_{prior\ art} = \Delta V/Rg = (VDD - Vmirror)/Rg$$

When mirror charges (Qgc) stored in a feedback capacitance (Cgc) are used, a time period in which the voltage Vce of the IGBT 1 is shifted into the ON state is expressed by:

$$T_{V\_ON\ prior\ art} = Qgc \times Rg/(VDD - Vmirror)$$

Therefore, the time period becomes longer as the mirror voltage is higher.

However, when the gate is driven with the constant current as shown in FIG. 1, a time period in which the voltage Vce of the IGBT 1 is shifted into the ON state is expressed by:

$$T_{V\_ON} = Qgc/Ig$$

Accordingly, the voltage Vce is shifted into ON in the fixed time period without being influenced by the mirror voltage.

Next, an OFF operation (turn-OFF operation), accordingly an operation in which "L" (a "low" level) is inputted as the control signal until the IGBT 1 is turned OFF, will now be described in detail. When the "L" is inputted as the control signal, the control signal of the OFF constant current is outputted by the decision/switch circuit 4. Thus, an OFF constant-current-pulse gate drive circuit 22 operates, and charges are released from the gate of the switching device 1 by a constant current, so that a gate capacitance (Cge+Cgc) is discharged by the constant current. On this occasion, before the gate voltage becomes the mirror voltage, the IGBT 1 remains ON (a period [5] to [6] in FIG. 2).

When the gate voltage lowers to the mirror voltage, the voltage Vce begins to rise gradually, and it is shifted into OFF. On this occasion, the storage time of the mirror charges (Qgc) to be stored in the feedback capacitance (Cgc) is the OFF time of the voltage Vce.

In the prior-art "constant voltage-resistance" drive, the storage time of the mirror charges (Qgc) is expressed by:

$$T_{V\_OFF\ prior\ art} = Qgc \times Rg/Vmirror$$

Therefore, a time period till the OFF shift of the voltage Vce becomes shorter as the mirror voltage is higher.

In contrast, when the gate is driven with the constant current as shown in FIG. 1, a time period till the OFF shift of the voltage Vce is expressed by:

$$T_{V\_OFF} = Qgc/Ig$$

Accordingly, the voltage Vce is shifted into OFF in the fixed time period without being influenced by the mirror voltage (a period [6] to [8] in FIG. 2).

When the gate voltage has become lower than the mirror voltage, the voltage Vce has already been shifted into OFF, and hence, a capacitance as seen from the gate drive apparatus decreases from the previous value (Cge+Cgc) to Cge.

In addition, when the discharge is further continued, the collector current Ic of the IGBT 1 is shifted into OFF. At an initial stage here, the gate voltage is the mirror voltage, and hence, the collector current Ic of the IGBT 1 is the current I (A). However, when the gate voltage decreases gradually and is shifted to the threshold voltage Vth, the collector current Ic becomes substantially 0 (A) and is shifted into OFF (a period [8] to [9] in FIG. 2).

In the prior-art "constant voltage-resistance" drive, a time period in which the current turns from ON to OFF, accordingly a period in which the gate voltage becomes lower than the mirror voltage and becomes the threshold voltage Vth is expressed by:

$$T_{I\_OFF\ prior\ art} = Cge \cdot Rg \cdot \ln(1 + 1/Vth \cdot \sqrt{(Ic/gm)})$$

and it depends upon the threshold voltage Vth. In contrast, when the gate is driven with the constant current as shown in FIG. 1, the corresponding period is expressed by:

$$t_{I\_OFF} = Cge/Ig \times \sqrt{(Ic/gm)}$$

Accordingly, the period becomes independent of the voltage Vth, and the current is shifted into OFF in the fixed time period.

As described above in detail, when the gate is driven with the constant current, the variance of a switching speed can be sharply suppressed.

Incidentally, the device used in FIG. 2 is an example having the following characteristics: In the ON operation, the voltage Vce is abruptly shifted into ON in the period [2] to [3] and is completely shifted into ON (Vcesat) at a time point [4]. Besides, in the OFF operation, the voltage Vce is slowly shifted into OFF in a period [6] to [7] and is abruptly shifted into OFF in a period [7] to [8]. In this regard, there is also a device in which the voltage Vce is shifted with a constant dV/dt in the period [2] to [4] or the period [6] to [8].

Next, practicable circuit examples of the individual constituents in FIG. 1 will be described. As stated before, owing to the constant current drive, the variance of the switching speed dependent upon the voltages VDD and Vth (and the mirror voltage) can be eliminated. A high-speed constant-current drive circuit which is drivable at a high speed and as to which the variance of the gate current Ig is small is required for realizing the elimination of the variance of the switching speed.

Figure 3:
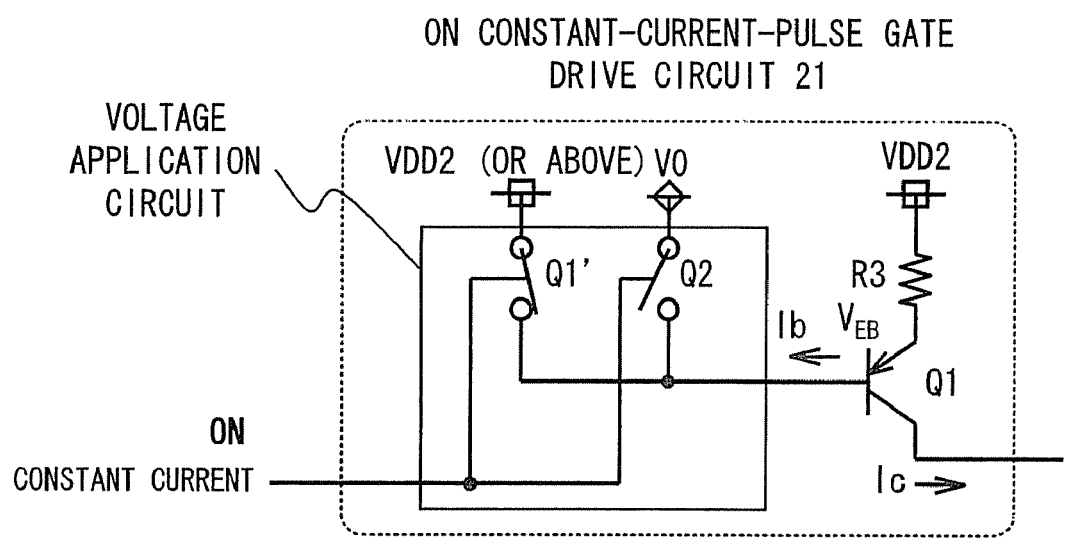
FIG. 3 is a circuit diagram of an ON constant-current-pulse gate drive circuit 21.

FIG. 3 shows a practicable arrangement example of the ON constant-current-pulse gate drive circuit 21. The ON constant-current-pulse gate drive circuit 21 which is capable of constant current drive at a high speed receives an ON constant-current operation command, and outputs a voltage V0 at a high speed through the turn-OFF of a switch Q1' and the turn-ON of a switch Q2. Thus, the base voltage of a transistor Q1 becomes the voltage V0, and the constant current drive becomes possible as understood from the following formulas:

$$VDD2 - R3 \times (Ib + Ic) - V_{EB} = VO$$

$$Ib = Ic/h_{FE}$$

From the above two formulas, $$Ic = (VDD2 - V_{EB} - VO)/R3 \times \{h_{FE}/(h_{FE} + 1)\}$$

Besides, in order to stop a constant current, the switch Q2 is turned OFF, and the switch Q1' is turned ON, whereby to a voltage VDD2 or a voltage of or above the voltage VDD2 is outputted at a high speed. Thus, the base current of the transistor Q1 is prevented from flowing, and the transistor Q1 is turned OFF.

On this occasion, in order to drive the gate with a high-speed constant current, it is required that "the voltage V0 is supplied at the high speed" and that "the transistor Q1 responds at a high speed". These conditions depend upon the performance of the device-individual. Since, however, discrete devices are used, the gate drive circuit 21 can be easily configured by employing high-speed switching devices of low capacitances.

Next, there will be explained the phenomenon that the variance of the gate current Ig (indicated as "Ic" in FIG. 3) is suppressed by raising the supply voltage of the constant-current drive circuit.

In the ON constant-current-pulse gate drive circuit 21, when the switch Q2 is turned ON by the control signal of the ON constant current, the voltage VO becomes the base voltage of the transistor Q1, and the constant current drive is performed. When the output voltage of the transistor Q1 becomes the voltage VO or above, the circuit fails to operate with the constant current. Therefore, the voltage V0 must be made the greatest mirror voltage or above in which the variance of the switching device 1 to be driven is considered.

On this occasion, the following holds in a region in which the constant current operation proceeds:

$$Ic = (VDD2 - V_{EB} - VO)/R3 \times \{h_{FE}/(h_{FE} + 1)\}$$

In general, however, the voltage $V_{EB}$ has an individual difference variance, and hence, it forms a cause for the variance of the constant current. When two devices are employed in consideration of the variance of the voltage $V_{EB}$, and the $V_{EB}$ voltages of the two devices are respectively denoted by $V_{EB1}$ and $V_{EB2}$, the following holds:

$$I_{C1}/I_{C2} = (VDD2 - VO - V_{EB1})/(VDD2 - VO - V_{EB2})$$

Thus, in a case, for example, where VDD2=15 V, VO=13.5 V and $V_{EB}$=0.8 to 1.0 V are assumed, the following holds:

$$I_{C1}/I_{C2} = (15\,V - 13.5\,V - 0.8\,V)/(15\,V - 13.5\,V - 1.0\,V) = 0.7\,V/0.5\,V = 1.4$$

Accordingly, an error of about 40% develops.

However, when the voltage VDD2 is set at 19 V being 4 V higher, the formula is calculated as:

$$I_{C1}/I_{C2} = (19\,V - 13.5\,V - 0.8\,V)/(19\,V - 13.5\,V - 1.0\,V) = 4.7\,V/4.5\,V = 1.044.$$

Thus, the error becomes about 4.4%, and the variance of the constant current Ig can be greatly improved.

As stated above, it is possible to realize the high-speed constant-current drive circuit which performs the high-speed constant current operation and in which the variance of the constant current Ig with the variance of the device taken into consideration is little.

Figure 4:
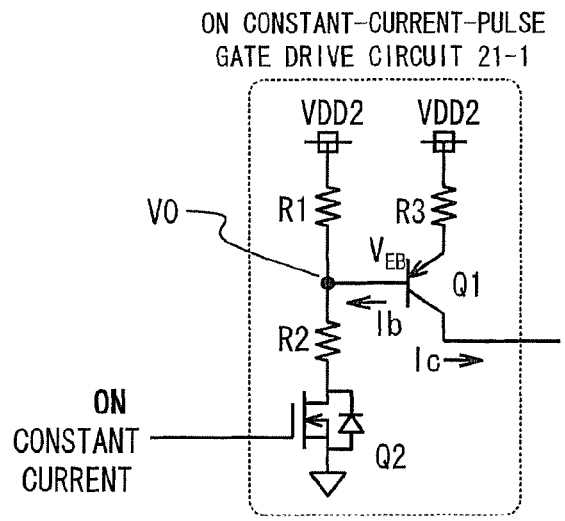
FIG. 4 is a circuit diagram of an ON constant-current-pulse gate drive circuit 21-1.

FIG. 4 shows an ON constant-current-pulse gate drive circuit 21-1 which is a modification to the embodiment in FIG. 3. In the circuit in FIG. 4, when a switch Q2 is turned ON, a voltage value VO divided by resistances R1 and R2 becomes the base voltage of a transistor Q1, and the switch Q2 is turned OFF, whereby a voltage VDD2 can be applied to the base of the transistor Q1.

As stated above, an enhanced precision becomes possible by setting VDD2>VDD1, and the switching speed variance can be sharply reduced. However, when the gate of the IGBT 1 is continued to be driven by only the ON constant-current-pulse gate drive circuit 21, the high voltage of the supply voltage VDD2 is applied to the gate. It is accordingly apprehended that the reliability of a gate oxide film will degrade, and that gate breakdown will be induced in the worst case.

Therefore, after the end of the shift period of ON or OFF, the gate drive circuit is switched from the constant-current-pulse gate drive circuit 2 to the constant-voltage-pulse gate drive circuit 3, by the decision/switch circuit 4 which observes the gate voltage and which performs the switching control between the constant current drive and the constant voltage drive. Thus, any overvoltage is prevented from being applied. Incidentally, the power source of the constant-voltage-pulse gate drive circuit 3 is made the voltage VDD1, and the voltage which does not degrade the reliability of the gate oxide film is set.

Figure 5:
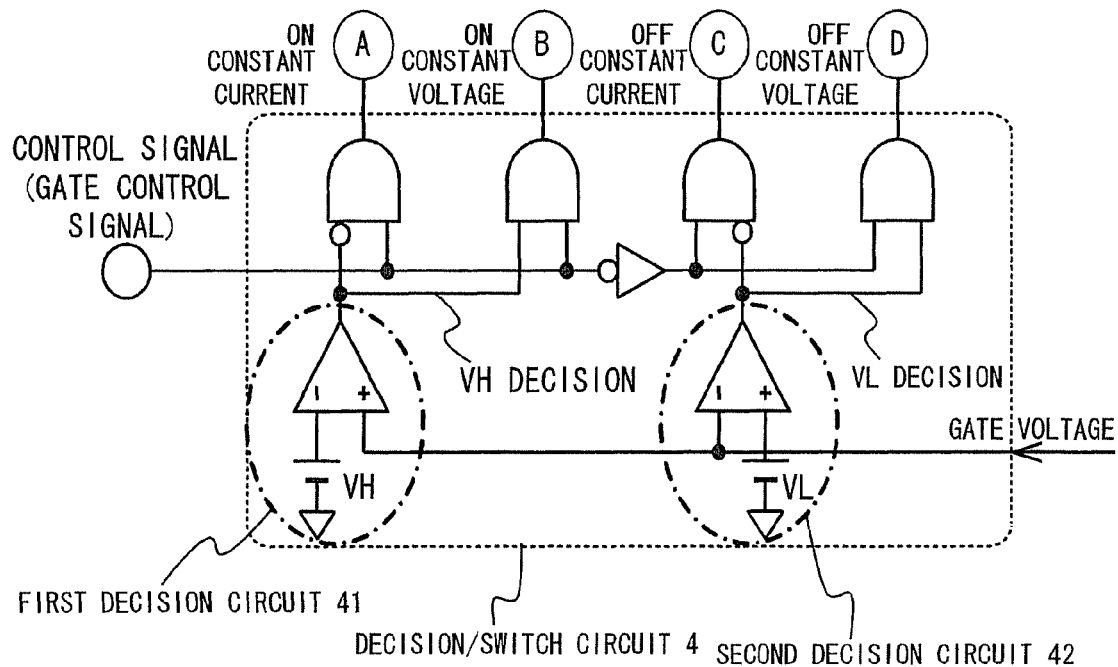
FIG. 5 is a circuit diagram of a decision/switch circuit 4.

FIG. 5 shows an example of the decision/switch circuit 4. When the decision/switch circuit 4 receives the control signal (gate control signal) "H", it makes an OFF signal inactive and outputs an ON signal. On this occasion, the gate voltage of the IGBT 1 is observed. If it is decided by a first decision circuit 41 that the gate voltage is, at most, a voltage VH being a first set value (a value which is the greatest variance value of the mirror voltage, or above is set as the voltage VH), the signal of the ON constant current is outputted, and when the gate voltage exceeds the first set value VH, the signal of the ON constant current is switched to the signal of the ON constant voltage.

Besides, when the decision/switch circuit 4 receives the control signal "L", it makes the ON signal inactive and outputs the OFF signal. On this occasion, the gate voltage of the IGBT 1 is observed. If it is decided by a second decision circuit 42 that the gate voltage is, at least, a voltage VL being a second set value (a value which is the least Vth voltage, or below is set as the voltage VL), the signal of the OFF constant current is outputted, and when the gate voltage becomes less than the second set value VL, the signal of the OFF constant current is switched to the signal of the OFF constant voltage.

Thus, the switching drive control between the constant-current-pulse gate drive circuit 2 and the constant-voltage-pulse gate drive circuit 3 is performed, and any overvoltage is prevented from being applied to the gate.

By the way, in a case where the mirror voltage is low in consideration of the Ig (gate current) variance of the constant-current-pulse gate drive circuit 21 and where the voltage of the supply voltage VDD2 has become VDD2<(the gate recommendation voltage (VDD1)) of IGBT 1, the voltage VDD2 may well be made the same as the voltage VDD1. Also, as practicable examples will be indicated later, it is possible to adopt a scheme in which the constant current drive and the constant voltage drive are switched for only the ON shift or for only the OFF shift.

Incidentally, the contents of a patent document (Japanese Patent No. 3,680,722 (refer chiefly to Sectors [0025] to [0027] and FIG. 8)), which the inventors studied for reference in pursuing the constant-current drive circuit described above, will be introduced below.

Figure 8:
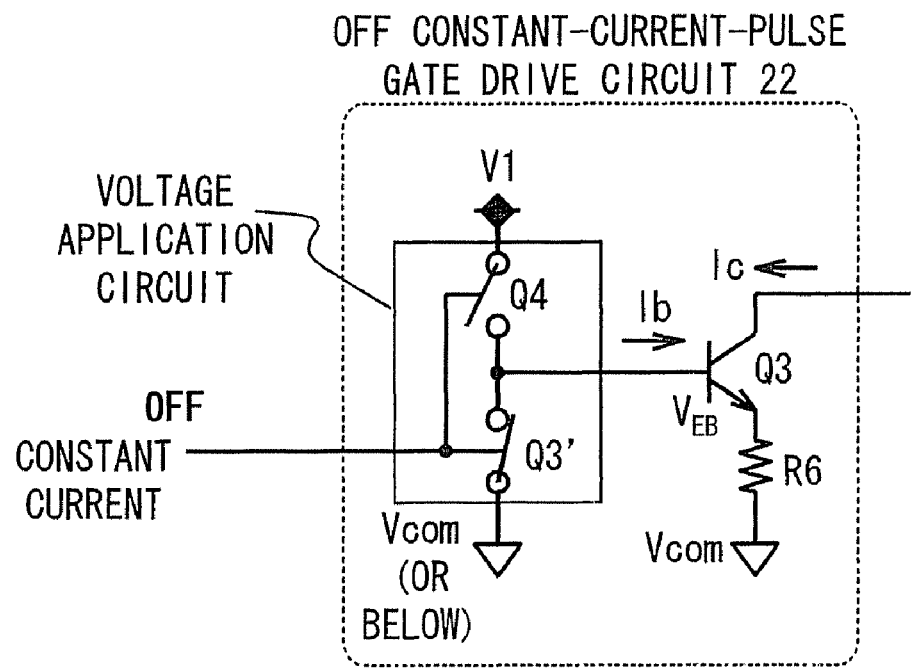
FIG. 8 is a circuit diagram of an OFF constant-current-pulse gate drive circuit 22.

In FIG. 8 of the patent document, a constant current circuit based on an OP amplifier is used for drive with a constant current, and the operation of suppressing a gate current is performed only in a period in which a current or a voltage changes.

However, even in the constant current circuit based on the OP amplifier of comparatively high-speed operation, the response characteristic of the constant current to a command value is not very high in speed, and especially in turning OFF the constant current, it was difficult to attain a characteristic expected by the inventors. This is conjectured to be ascribable to a response rate and an output slew rate within the OP amplifier, the gate characteristic of a MOS-FET to-be-driven, the "supply voltage versus maximum output voltage" characteristic of the OP amplifier, etc. Therefore, a response delay to a constant-current increasing command and a response delay to a constant-current decreasing command (OA) arise, and especially the response delay at the time of the constant-current decreasing command necessitates a long time for the OFF operation of a transistor Q12 shown in FIG. 8 of the patent document, on account of an insufficient slew rate. In addition, there are the possibility that a state where an excessive through current flows through constituents E1, R12, Q12, Q13 and R13 will occur at the timing of the turn-OFF of the device and the turn-ON of the transistor Q13, and the possibility that the IGBT will continue to be ON for a period before the turn-OFF of the transistor Q12, on account of the division voltage of the resistances R12 and R13.

Besides, since the gate capacitance and feedback capacitance of the transistor Q12 form a considerably large capacitance load for the OP amplifier, there are the possibility of oscillations and the possibility of abnormal heat generation due to the increase of an output effective current.

Therefore, the high-speed drive circuit of this embodiment as shown in FIG. 3 is required. Incidentally, although the constituent Q1 of the ON constant-current-pulse gate drive circuit 21 is exemplified as the transistor, it may well be replaced with a circuit which uses an FET or the like element being controllable with a current.

As a further state of use, in an arm short-circuit mode or the like abnormal situation where the switching device 1 is to be shifted into a cutoff sequence at a high speed, the delay of a time period until the gate current supply is stopped might become a fatal problem.

Now, circuit examples in the case where the heightened speed of the constant current drive OFF is necessitated in the ON constant-current-pulse gate drive circuit 21 will be described with reference to FIGS. 6 and 7.

Figure 6:
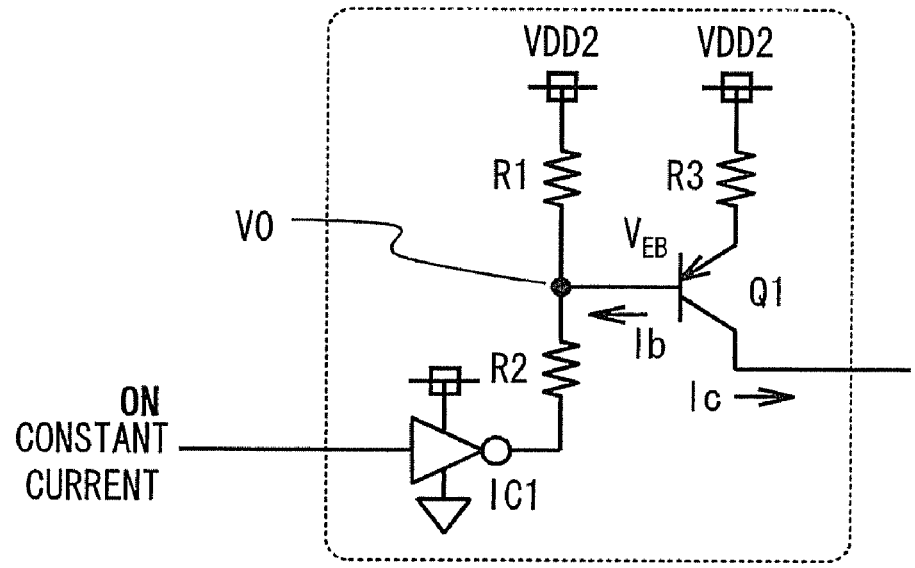
FIG. 6 is a circuit diagram of an ON constant-current-pulse gate drive circuit 21-2.

The ON constant-current-pulse gate drive circuit 21-2 in FIG. 6 uses the type of IC drive capable of level conversion, and it outputs the "L" in a constant current operation and performs the constant current operation by resistances R1 to R3 and a transistor Q1. At a timing at which a constant current is stopped, the voltage VDD2 is supplied from an IC 1, whereby the transistor Q1 can be instantly turned OFF. Therefore, the OFF speed of the transistor Q1 stated before can be further enhanced.

Figure 7:
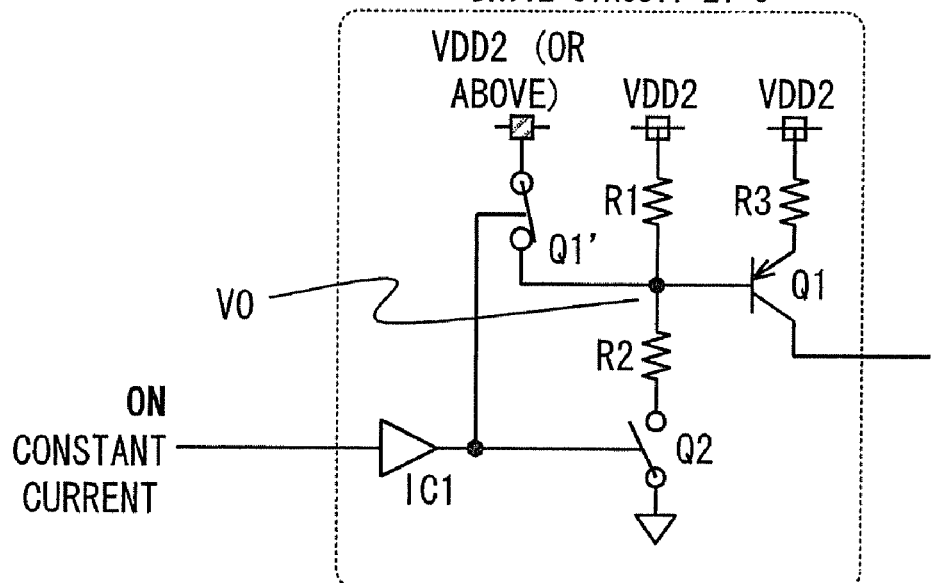
FIG. 7 is a circuit diagram of an ON constant-current-pulse gate drive circuit 21-3.

The ON constant-current-pulse gate drive circuit 21-3 in FIG. 7 sets the control signal at the "H" in a constant current operation, to turn OFF a switch Q1' and turn ON a switch Q2, and it performs the constant current operation by resistances R1 to R3 and a transistor Q1. At a timing at which a constant current is stopped, the control signal is set at the "L" to turn OFF the switch Q2 and turn ON the switch Q1'. The voltage VDD2 or the voltage of or above the voltage VDD2 is directly supplied to the base of the transistor Q1 by a current from the switch Q1', whereby the transistor Q1 can be instantly turned OFF, and simultaneously, the output capacitance and feedback capacitance of the transistor Q2 can be charged. Therefore, the OFF speed of the transistor Q1 stated before can be further enhanced.

Incidentally, a semiconductor switching device such as MOS-FET or transistor is mentioned as an example of each of the switches Q2 and Q1'.

Likewise to the ON constant-current-pulse gate drive circuit 21, the OFF constant-current-pulse gate drive circuit 22 for use in the constant-current-pulse gate drive circuit 2 requires a high-speed constant-current drive circuit which is drivable at a high speed and as to which the variance of the gate current Ig is small.

FIG. 8 shows the OFF constant-current-pulse gate drive circuit 22 which is capable of constant current drive at a high speed. Referring to the figure, when an OFF constant-current operation command is received, a switch Q3' is turned OFF, and a switch Q4 is turned ON, thereby to output a voltage V1 at a high speed. Thus, the base voltage of a transistor Q3 becomes the voltage V1, and the constant current drive becomes possible as indicated below.

$$R6 \times (Ib+Ic) + V_{BE} = V1$$

$$Ib = Ic/h_{FE}$$

From the above two formulas, the following holds:

$$Ic = (V1 - V_{BE})/R6 \times \{h_{FE}/(h_{FE}+1)\}$$

Besides, in order to stop a constant current, the switch Q4 is turned OFF, and the switch Q3' is turned ON, whereby a common potential (Vcom) voltage or a voltage of or below the potential Vcom is outputted at a high speed. Thus, the base current of the transistor Q3 is prevented from flowing, and the transistor Q3 is turned OFF. Incidentally, the common potential (Vcom)=0 V is held in the above formula.

On this occasion, in order to drive the gate with the high-speed constant current, it is required that "the voltage V1 is supplied at the high speed" and that "the transistor Q3 responds at a high speed". These conditions depend upon the performance of the device-individual. Since, however, discrete devices are used, the gate drive circuit 22 can be easily configured by employing high-speed switching devices of low capacitances.

Besides, the variance of the gate current Ig (indicated as "Ic" in FIG. 8) can be suppressed by lowering the potential Vcom of the constant-current drive circuit to or below 0 V. The reason why the variance can be suppressed, will be explained below.

In the OFF constant-current-pulse gate drive circuit 22, when the switch Q4 is turned ON by the control signal of the OFF constant current, the voltage V1 becomes the base voltage of the transistor Q3, and the constant current drive is performed. When the output voltage of the transistor Q3 becomes the voltage V1 or below, the circuit fails to operate with the constant current. Therefore, the voltage V1 must be made the least Vth voltage or below in which the variance of the switching device 1 to be driven is considered.

On this occasion, the following holds in a region in which the constant current operation proceeds:

$$Ic = (V1 - Vcom - V_{EB})/R6 \times \{h_{FE}/(h_{EE}+1)\}$$

In general, however, the voltage $V_{EB}$ has an individual difference variance, and hence, it forms a cause for the variance of the constant current. When two devices are employed in consideration of the variance of the voltage $V_{EB}$, and the $V_{EB}$ voltages of the two devices are respectively denoted by $V_{EB1}$ and $V_{EB2}$, the following holds:

$$I_{C1}/I_{C2} = (V1 - Vcom - V_{EB1})/(V1 - V_{EB2})$$

Thus, in a case, for example, where Vcom=0 V, V1=4.5 V and $V_{EB}$=0.8 to 1.0 V are assumed, the following holds:

$$I_{C1}/I_{C2}=(4.5\text{ V}-0\text{ V}-0.8\text{ V})/(4.5\text{ V}-0\text{ V}-1.0\text{ V})=3.7\text{ V}/3.5\text{ V}=1.057$$

Accordingly, an error of about 5.7% develops.

However, when the voltage Vcom is set at −4 V being 4 V lower, the formula is calculated as:

$$I_{C1}/I_{C2}=\{4.5\text{ V}-(-4\text{ V})-0.8\text{ V}\}/\{(4.5\text{ V}-(-4\text{V})-1.0\text{ V})\}=7.7\text{ V}/7.5\text{ V}=1.0266$$

Thus, the error becomes about 2.7%, and the variance of the constant current Ig can be improved.

As stated above, it is possible to realize the high-speed constant-current drive circuit which performs the high-speed constant current operation and in which the variance of the constant current Ig with the variance of the device taken into consideration is little.

Incidentally, although the constituent Q3 of the OFF constant-current-pulse gate drive circuit 22 is exemplified as the transistor, it may well be replaced with a circuit which uses an FET or the like element being controllable with a current.

Figure 9:
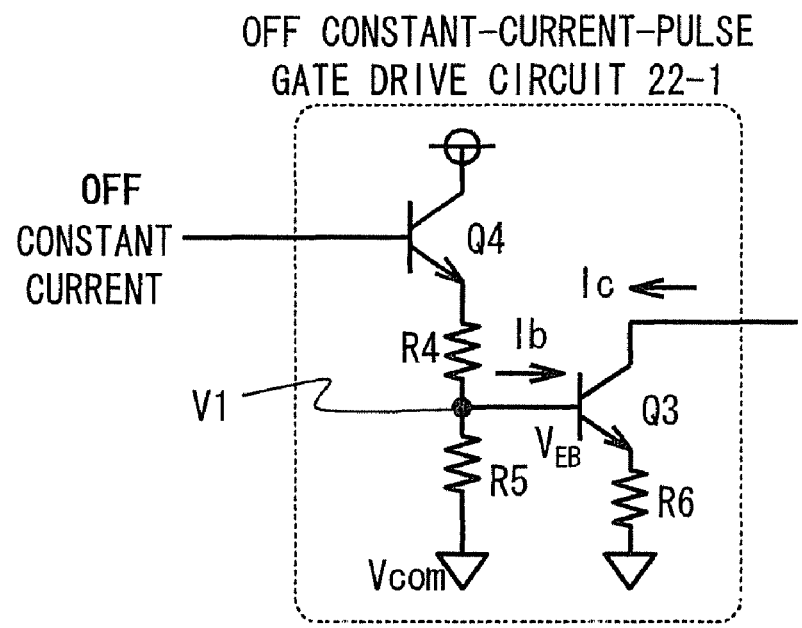
FIG. 9 is a circuit diagram of an OFF constant-current-pulse gate drive circuit 22-1.

FIG. 9 shows an OFF constant-current-pulse gate drive circuit 22-1 which is a modification to the embodiment in FIG. 8. In the circuit in FIG. 9, when a transistor Q4 is turned ON, an OFF constant current signal is current-amplified by a voltage follower, a voltage value V1 divided by resistances R4 and R5 becomes the base voltage of a transistor Q3, and the transistor Q4 is turned OFF, whereby a voltage Vcom can be applied to the base of the transistor Q3.

Incidentally, also in this circuit example, the voltage Vcom may well be set at a minus voltage, not at the emitter voltage of the switching device 1, in order to decrease the variance of the constant current in consideration of the variance of the voltage $V_{BE}$.

Next, circuit examples in the case where the heightened speed at the stop of the constant current drive is necessitated in the OFF constant-current-pulse gate drive circuit 22 will be described with reference to FIGS. 10 and 11.

Figure 10:
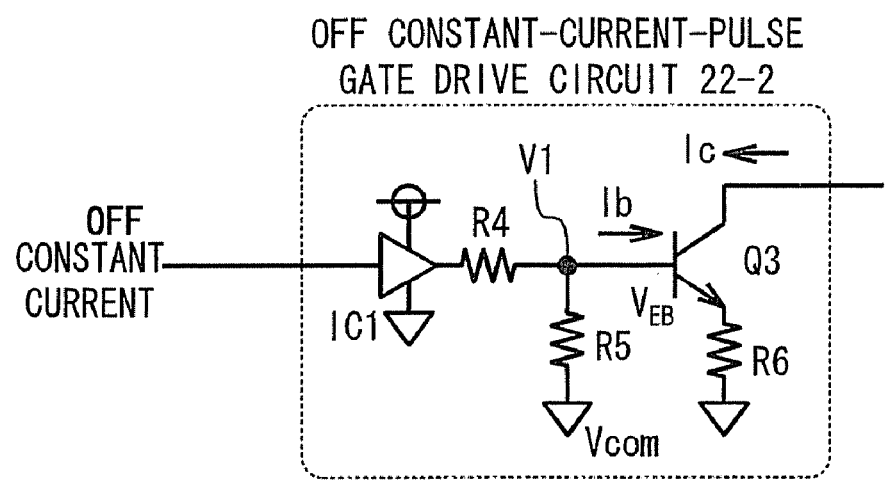
FIG. 10 is a circuit diagram of an OFF constant-current-pulse gate drive circuit 22-2.

The OFF constant-current-pulse gate drive circuit 22-2 in FIG. 10 adopts a configuration in which the control signal of an OFF constant current is buffered by a device IC1, thereby to attain an output voltage precision and to obtain a drive current. A circuit current for the voltage division of resistances R4 and R5, and the base current Ib of a transistor Q3 are required as the drive current.

Figure 11:
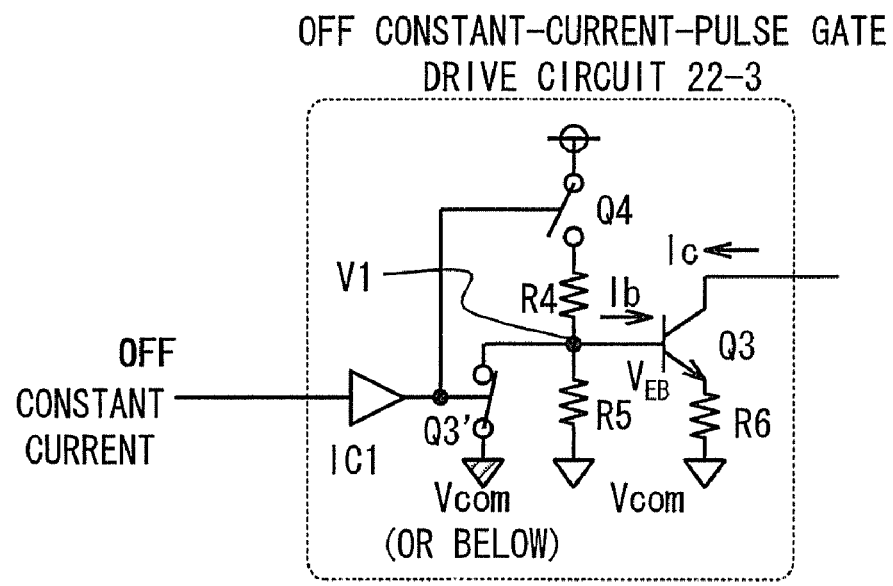
FIG. 11 is a circuit diagram of an OFF constant-current-pulse gate drive circuit 22-3.

The OFF constant-current-pulse gate drive circuit 22-3 in FIG. 11 sets the control signal at the level "H" so as to turn OFF a switch Q3' and turn ON a switch Q4 in a constant current operation, and it performs the constant current operation by resistances R4 to R6 and a transistor Q3. At a timing at which a constant current is stopped, the control signal is set at the level "L" to turn OFF the switch Q4 and turn ON the switch Q3'. The voltage Vcom or the voltage of or less than the voltage Vcom is directly supplied to the base of the transistor Q3 by a current to the switch Q3', whereby the transistor Q3 can be instantly turned OFF, and simultaneously, the output capacitance and feedback capacitance of the switch Q4 can be charged. Therefore, the OFF speed of the transistor Q3 stated before can be further enhanced.

Incidentally, a semiconductor switching device such as MOS-FET or transistor is mentioned as an example of each of the switches Q4 and Q3'.

Besides, when the variance of the voltage $V_{BE}$ is considered, ($V_{BE}$+R6×Ie) sometimes becomes higher than the least Vth value. On this occasion, a common potential indicated by a mark V is set at a minus voltage, not at the emitter voltage of the switching device 1, in order to decrease the variance of the constant current.

As described above, the invention can achieve remarkable advantages not existing in the prior art, as follows: At the transient stage of turn-ON, turn-OFF or the like, the gate is driven with the constant current, whereby the variance of a shift period attributed to the variances of the gate threshold voltage Vth and the mirror voltage can be suppressed to the minimum, and the variances of the switching speed and the switching loss can be sharply reduced. Further, the device can be driven without spoiling the reliability of the gate oxide film thereof, by switching the constant current drive to the constant voltage drive.

By the way, in the above, the constant-current-pulse gate drive circuits have been used for both the turn-ON and the turn-OFF, but if necessary, such a circuit can be used only at the turn-ON or only at the turn-OFF. A configurational example which switches the constant current drive and the constant voltage drive at the ON shift only, will be described below.

Under some conditions of use, a variance in the ON mode becomes problematic, or a variance in the OFF mode becomes problematic. In a case, for example, where a boosting converter is operated in a discontinuous mode, hard switching is performed in the OFF mode. Therefore, the variance in the OFF mode is suppressed, and the variance of the switching loss is suppressed. In the ON mode, the abrupt change of a voltage is involved, but a current for the charging of a boosting inductance changes much more slowly than the switching speed. Therefore, no problem is posed even when the ON constant-current drive circuit is not disposed.

Besides, in a pulse generator based on a PFN (pulse forming network), or the like, the variance in the ON mode becomes problematic, and the loss/performance of the pulse generator are not influenced even when the variance arises in the OFF mode. In this case, therefore, the OFF constant-current drive circuit is unnecessary.

Regarding inverter drive, in a case where the IGBT is subjected to a lifetime control and where the voltage Vcesat is lowered, a tail current flows in spite of the OFF constant-current drive, and the advantage of the constant current drive is sometimes unattainable. Also in such a case, the OFF constant-current-drive circuit is unnecessary, and an amount in which the loss varies due to the variance in the OFF mode may be suppressed by suppressing the variance by the ON constant-current drive circuit.

Especially in a case where the devices are connected in series or in parallel, the variance often becomes important in either the ON mode or the OFF mode, and hence, this modified embodiment is useful.

Figure 12:
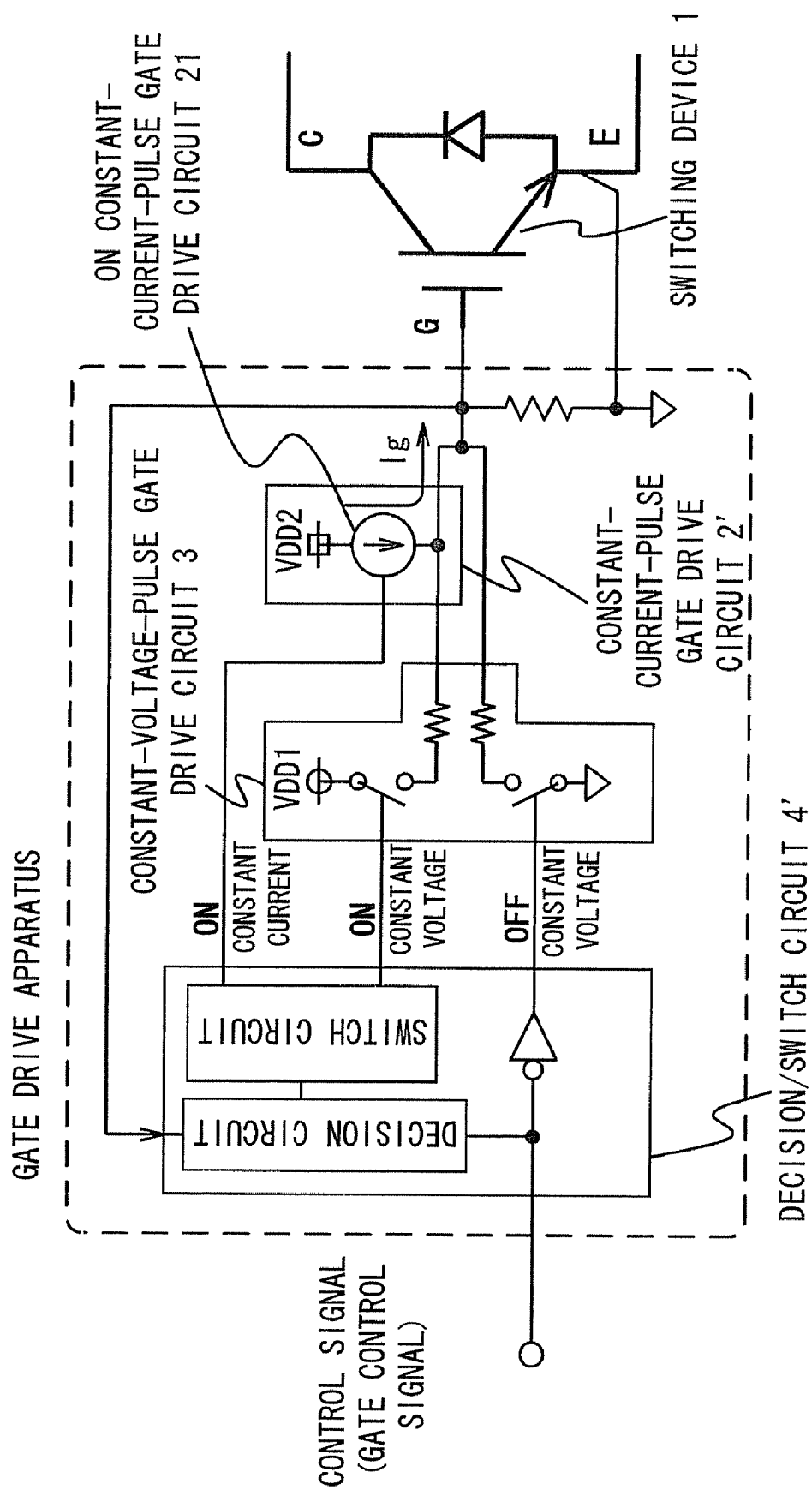
FIG. 12 is a general configurational diagram showing a second example of the gate drive apparatus according to Embodiment 1 of the invention.

FIG. 12 shows a gate drive apparatus which switches constant current drive and constant voltage drive in a turn-ON mode. A constant-current-pulse gate drive circuit 2' uses an ON constant-current-pulse gate drive circuit 21 which drives a switching device 1 with a constant current in only the ON mode. Simultaneously, a decision/switch circuit 4' receives, as inputs, a control signal (gate control signal) and the gate voltage of the switching device 1 (e.g., via the gate voltage detection circuit illustrated in FIG. 1), and it outputs the control signal of the ON constant current, the control signal of an ON constant voltage and the control signal of an OFF constant voltage.

Here, as in the foregoing description, a supply voltage VDD2 is set higher than a supply voltage VDD1, so as to suppress the variance of a constant-current set value attributed to the individual variances of components used in the constant-current drive circuit.

Figure 13:
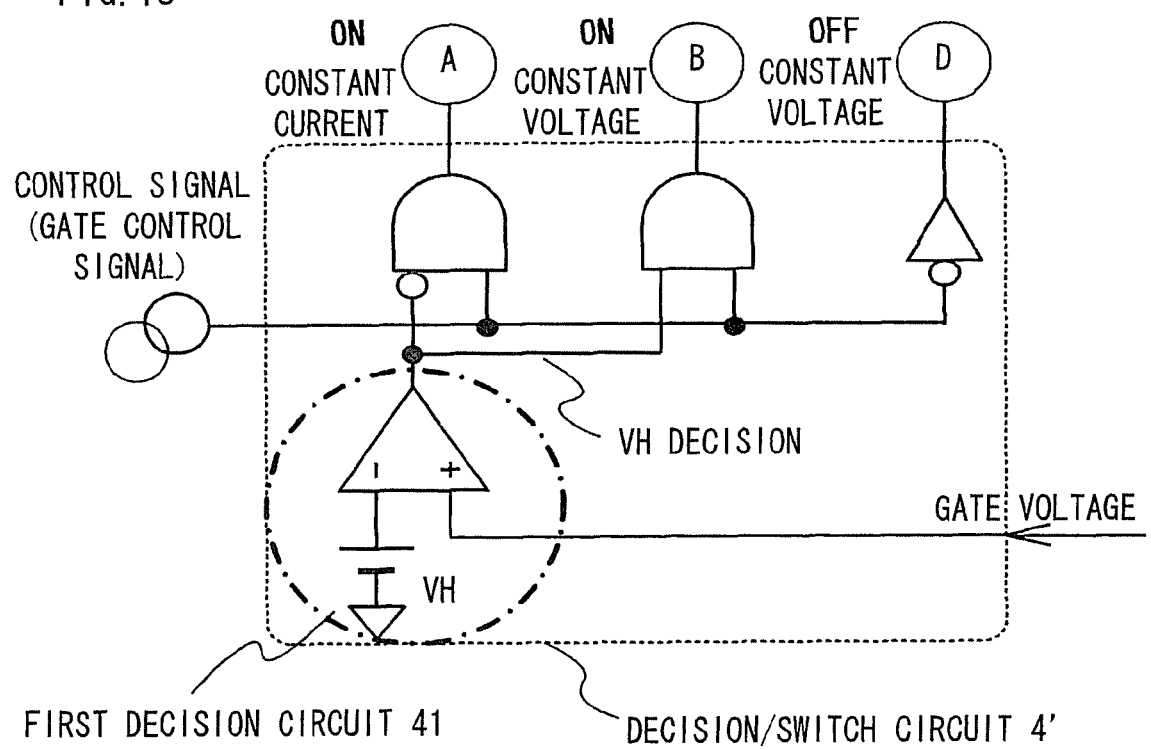
FIG. 13 is a circuit diagram of a decision/switch circuit 4' which is used in the second example of the gate drive apparatus.

A practicable example of the decision/switch circuit 4' is shown in FIG. 13. When the decision/switch circuit 4' receives the control signal "H", it makes the OFF signal inactive and outputs the ON signal. On this occasion, the gate voltage of the IGBT 1 is observed. If the gate voltage is, at most, a voltage VH (a value which is the greatest mirror voltage, or above is set as the voltage VH), the control signal of the ON constant current is outputted, and when the gate voltage becomes greater than the set value VH, the signal of the ON constant current is switched to the control signal of the ON constant voltage. When the decision/switch circuit 4' receives the control signal "L", it makes the ON signal inactive and outputs the control signal of the OFF constant voltage.

Thus, the drive controls of the constant-current-pulse gate drive circuit 2' and the constant-voltage-pulse gate drive circuit 3 are performed.

This configuration is usable in a case where the stabilization of a switching speed in the turn-ON mode and the reduction of the variance of a switching loss in the turn-ON mode are important. Owing to this configuration, remarkable advantages not existing in the prior art can be achieved as follows: At the transient stage of the turn-ON, the gate is driven with the constant current, whereby the variance of a shift period attributed to the variances of the gate threshold voltage Vth and the mirror voltage can be suppressed to the minimum, and the variances of the switching speed and the switching loss can be sharply reduced. Further, the device can be driven without spoiling the reliability of the gate oxide film thereof, by switching the constant current drive to the constant voltage drive.

Figure 14:
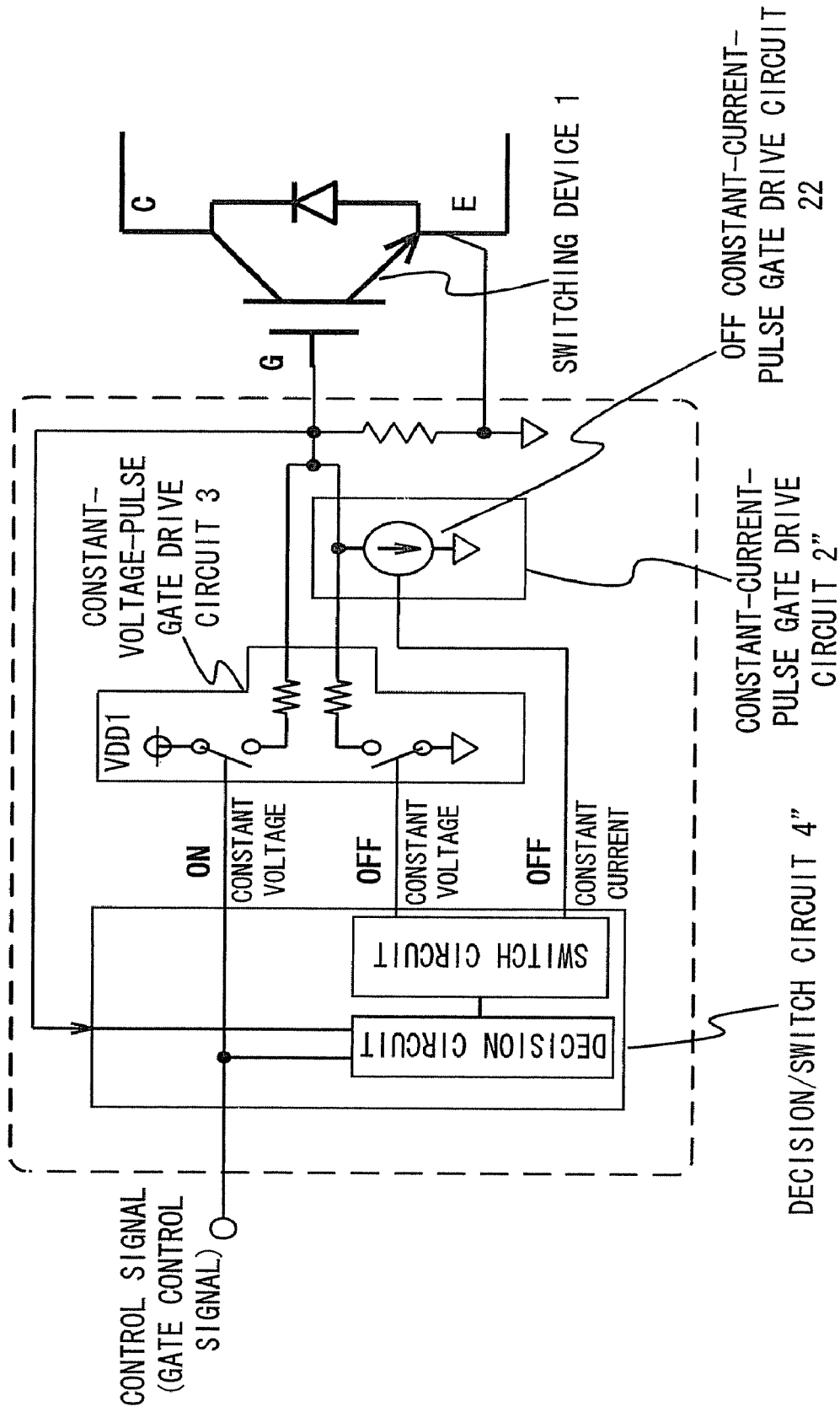
FIG. 14 is a general configurational diagram showing a third example of the gate drive apparatus according to Embodiment 1 of the invention.

FIG. 14 shows a gate drive apparatus which switches constant current drive and constant voltage drive in a turn-OFF mode. A constant-current-pulse gate drive circuit 2" uses an OFF constant-current-pulse gate drive circuit 22 which drives a switching device 1 with a constant current in only the OFF mode. Simultaneously, a decision/switch circuit 4" receives, as inputs, a control signal (gate control signal) and the gate voltage of the switching device 1 (e.g., via the gate voltage detection circuit illustrated in FIG. 1), and it outputs the control signal of the OFF constant current, the control signal of an ON constant voltage and the control signal of an OFF constant voltage.

Here, as in the foregoing description, a common potential of mark ∇ as is used in the constant-current-pulse gate drive circuit 2" may well be set at a minus voltage in order to decrease the variance of the constant current.

Figure 15:
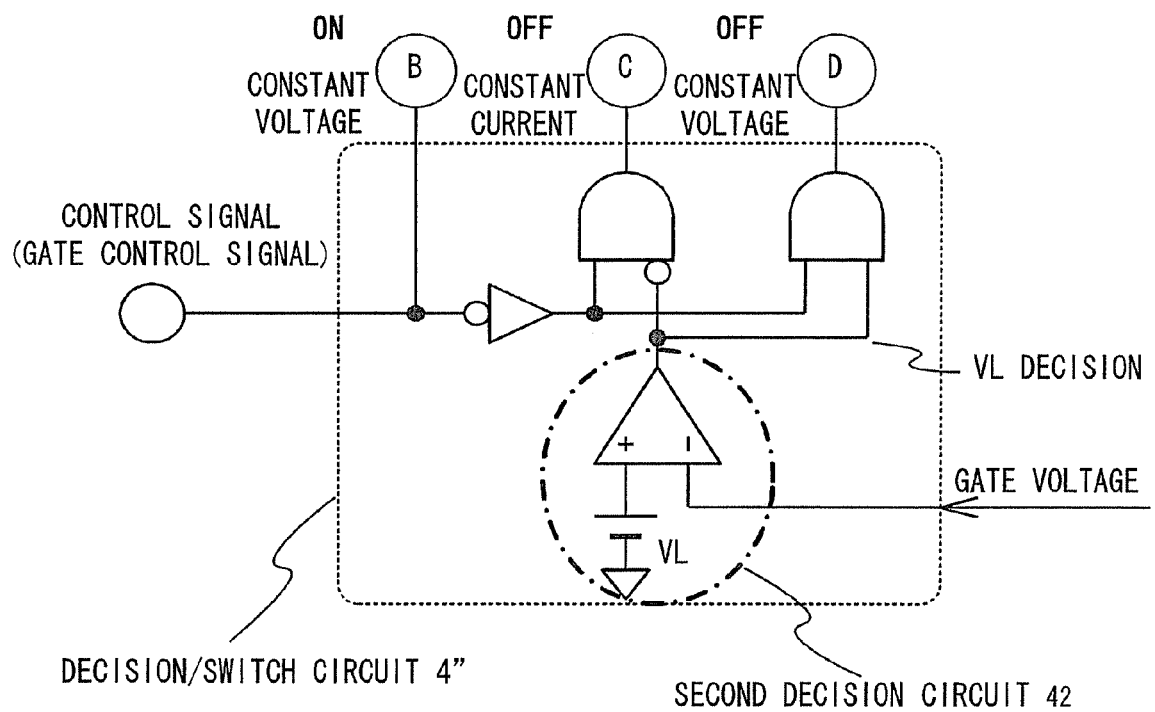
FIG. 15 is a circuit diagram of a decision/switch circuit 4" which is used in the third example of the gate drive apparatus.

A practicable example of the decision/switch circuit 4" in this case is shown in FIG. 15. When the decision/switch circuit 4" receives the control signal (gate control signal) "H", it makes the OFF signal inactive and outputs the control signal of the ON constant voltage. Besides, when the decision/switch circuit 4" receives the control signal "L", it makes the ON signal inactive and outputs the OFF signal. On this occasion, the gate voltage of the IGBT 1 is observed. If the gate voltage is, at least, a voltage VL (a value which is the least Vth voltage, or below is set as the voltage VL), the control signal of the OFF constant current is outputted, and when the gate voltage becomes less than the set value VL, the signal of the OFF constant current is switched to the control signal of the OFF constant voltage.

Thus, the drive controls of the constant-current-pulse gate drive circuit 2" and the constant-voltage-pulse gate drive circuit 3 are performed.

This configuration is usable in a case where the stabilization of a switching speed in the turn-OFF mode and the reduction of the variance of a switching loss in the turn-OFF mode are important. Owing to this configuration, it is possible to achieve such a remarkable advantage, not existing in the prior art, that the gate is driven with the constant current at the transient stage of the turn-OFF, whereby the variance of a shift period attributed to the variances of the gate threshold voltage Vth and the mirror voltage can be suppressed to the minimum, and the variances of the switching speed and the switching loss can be sharply reduced.

Second Embodiment

Figure 16:
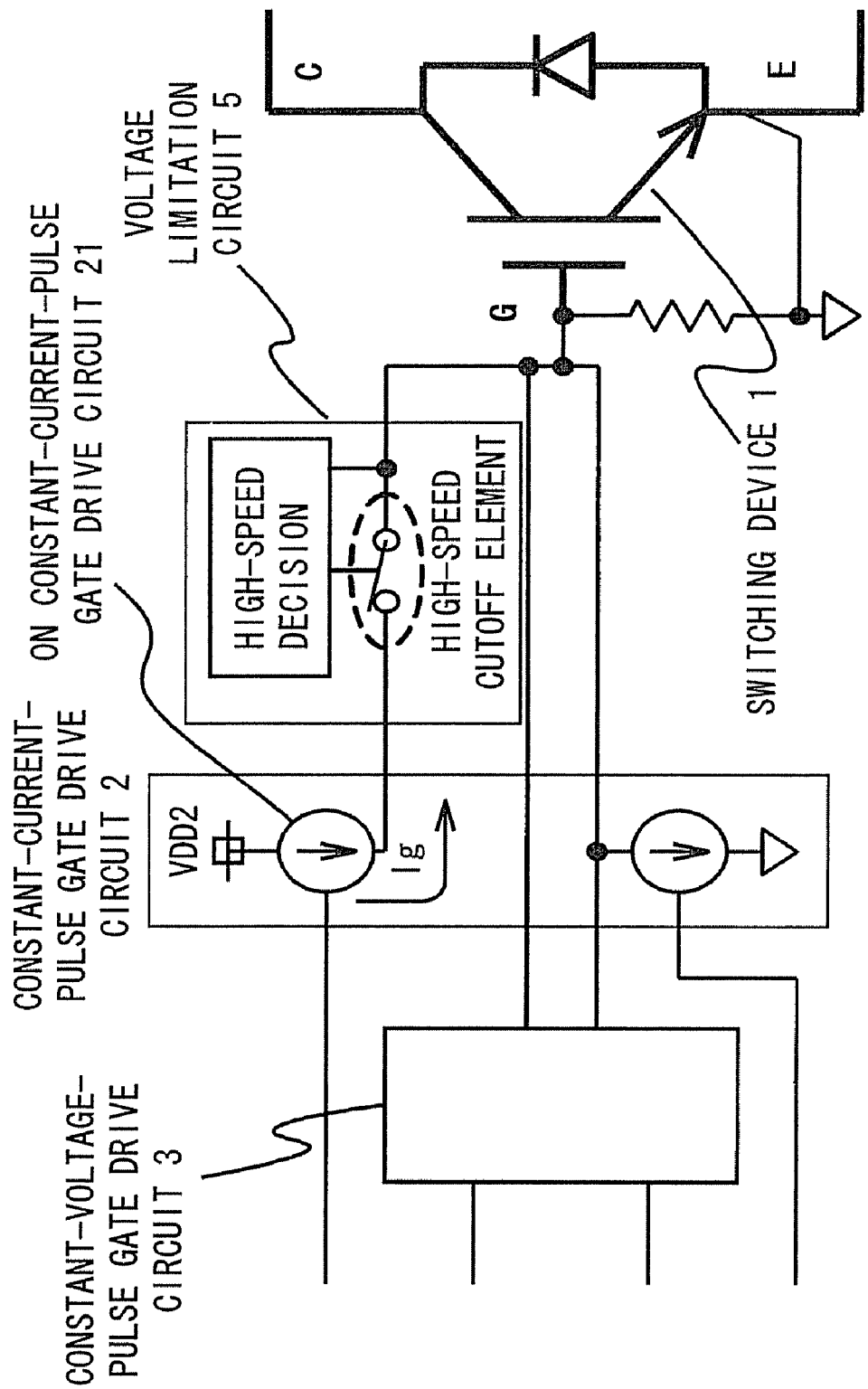
FIG. 16 is a partial configurational diagram of a gate drive apparatus according to Embodiment 2 of the invention.

In Embodiment 1, in a case where the switching from the constant current drive to the constant voltage drive needs to be performed at a high speed and where (VDD2>recommended gate voltage of the IGBT) is set on account of the response delays of the decision/switch circuit 4 and the constant-current-pulse gate drive circuit 2, the overvoltage is applied to the gate of the IGBT 1. It is accordingly apprehended that the reliability of the gate oxide film will degrade, and that the gate breakdown will be induced in the worst case. Therefore, a voltage limitation circuit 5 shown in FIG. 16 is mounted between the ON constant-current-pulse gate drive circuit 21 and the gate terminal of the IGBT 1.

The voltage limitation circuit 5 observes the gate signal at the output end thereof, and it turns OFF a high-speed cutoff element when the gate signal has become, at least, a prescribed voltage. Incidentally, the voltage limitation circuit 5 may well be controlled so as to continue a cutoff state during the OFF operation period, in interlocking with the control signal. A circuit example is shown in FIG. 17.

Figure 17:
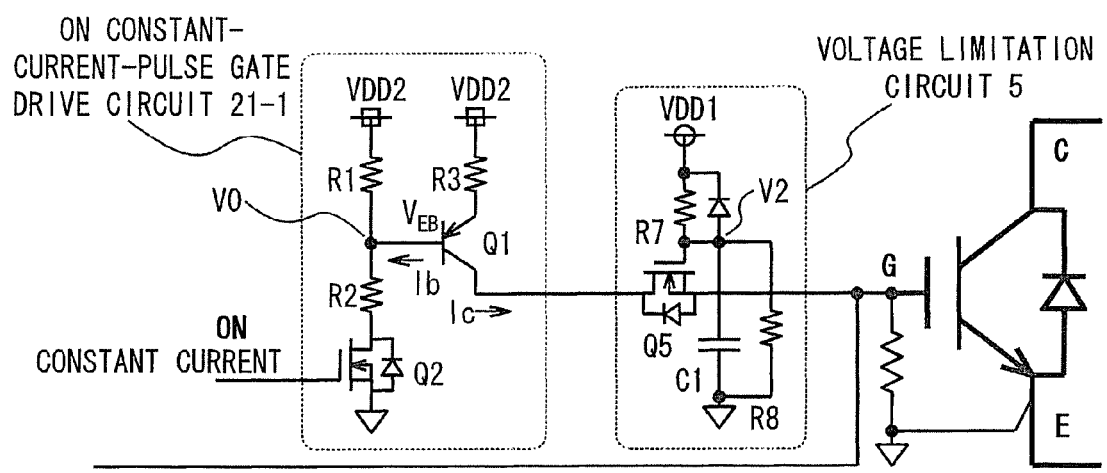
FIG. 17 is a circuit diagram of a voltage limitation circuit 5.

Referring to FIG. 17, a constituent Q5 for the voltage limitation circuit 5 is configured using an FET of high operating speed and low threshold voltage Vth. The source terminal of the FET Q5 is connected to the gate terminal of the IGBT 1, whereby the source voltage of the FET Q5 does not become a voltage applied to the gate of the FET Q5, or above. Accordingly, a voltage V2 joined to the gate of the FET Q5 is set at a voltage to be outputted and protected as is divided by resistances R7 and R8, whereby the gate of the IGBT 1 can be protected even in a case where the collector side output voltage of a transistor Q1 has risen more than is supposed, on account of the OFF delay of the transistor Q1 and the response delay of the decision/switch circuit 4.

There is, for example, a design example in which, in a case where the constant current drive is performed up to 13 V (the voltage VH of the first decision circuit 41 is set at 13 V), the gate voltage of the FET Q5 is set at 15 V by adding {1.5 (Vth of Q5)+0.5 V (corresponding to Id/gm)}.

Incidentally, since the gate voltage of the FET Q5 is strongly influenced by the gate voltage of the IGBT 1 at the source terminal of the FET Q5, it needs to be stabilized by a capacitance C1 or the like. Besides, in a case where the output is protected by the supply voltage VDD1, the voltage division by the resistances R7 and R8 is unnecessary, but the gate voltage needs to be stabilized by the capacitance C1 or the like.

Remarkable advantages not existing in the prior art are achieved by mounting the voltage limitation circuit 5 as described above, as follows: The OFF characteristic of the transistor Q1 can be moderated, and the response rate of the decision/switch circuit 4 can be moderated. Further, since the voltage VDD2 of the ON constant-current-pulse gate drive circuit 21 can be made higher, a voltage setting which suppresses the variance of the voltage $V_{EB}$ of the transistor Q1 and the variance of the constant-current set value attributed to a temperature characteristic is permitted, the stability of the constant current circuit is enhanced, and the gate of the device can be driven without spoiling the reliability of the gate oxide film thereof.

By the way, in FIG. 17, the ON constant-current-pulse gate drive circuit 21-1 is used as an example of the ON constant-current-pulse gate drive circuit, but another constant-current-pulse gate drive circuit may well be used. Further, even when the voltage limitation circuit 5 is used for the constant-voltage-pulse gate drive circuit 3, similar advantages are obtained, and the gate of the IGBT 1 can be protected. Besides, the use of the voltage limitation circuit 5 is not restricted to the configuration shown by circuit blocks in FIG. 16.

Figure 18:
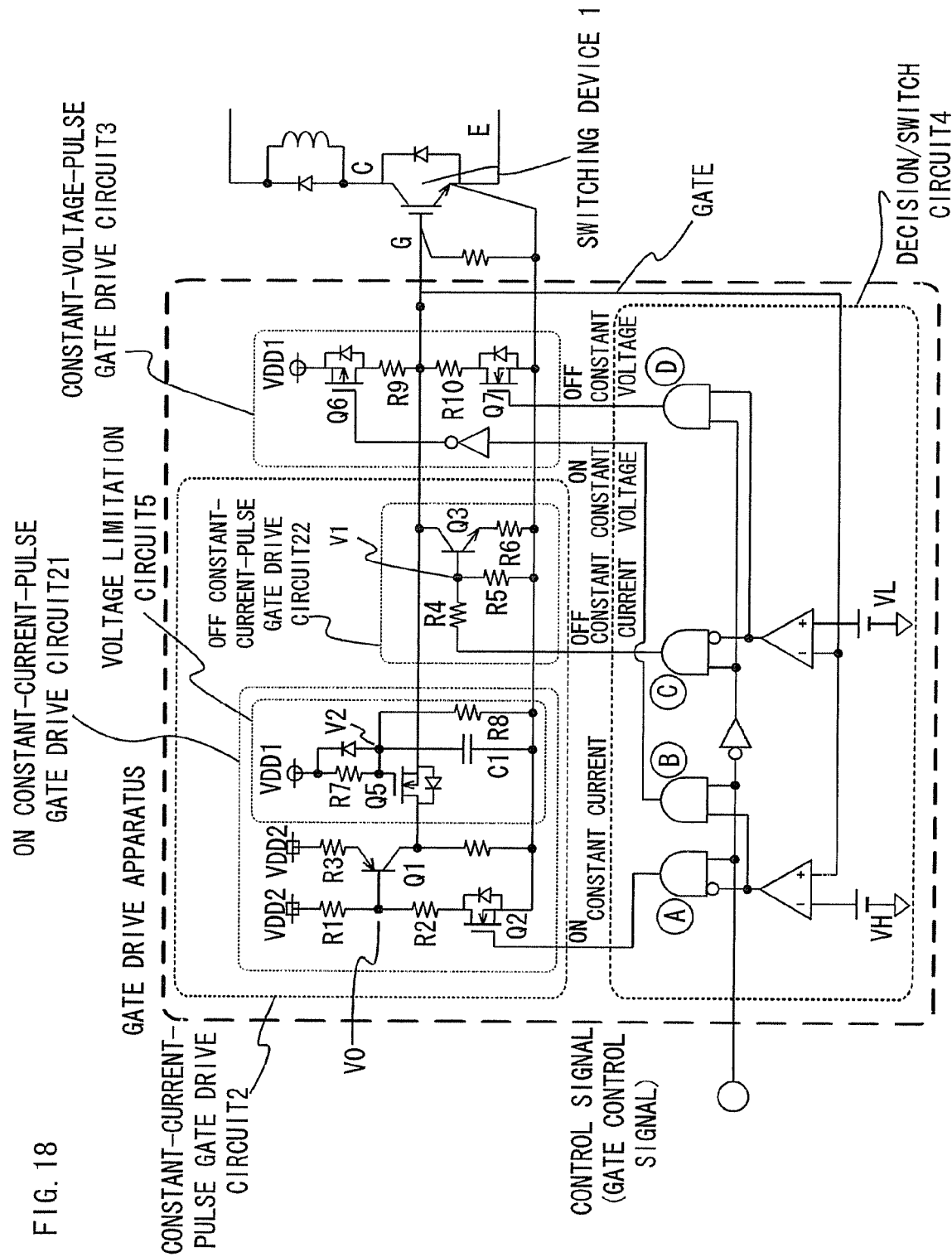
FIG. 18 is a general configurational diagram of the gate drive apparatus according to Embodiment 2 of the invention.

For the sake of reference, FIG. 18 shows an example of the general circuit arrangement of the gate drive apparatus realizing Embodiment 2.

Third Embodiment

As already stated, in the constant-current-pulse gate drive circuit 21 for use in Embodiment 1, the variance of the voltage $V_{EB}$ of the transistor Q1 and the temperature characteristic, for example, can form causes for the constant-current variance of the constant-current-pulse gate drive circuit 2.

Figure 19:
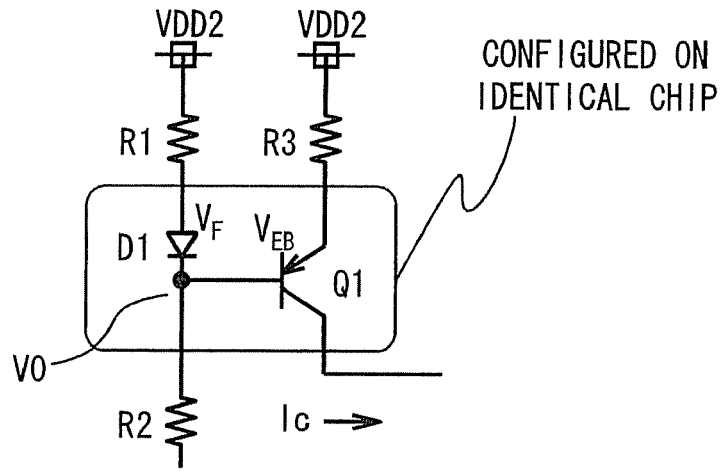
FIG. 19 shows an improved circuit example 1 for element variances according to Embodiment 3 of the invention.
Figure 20:
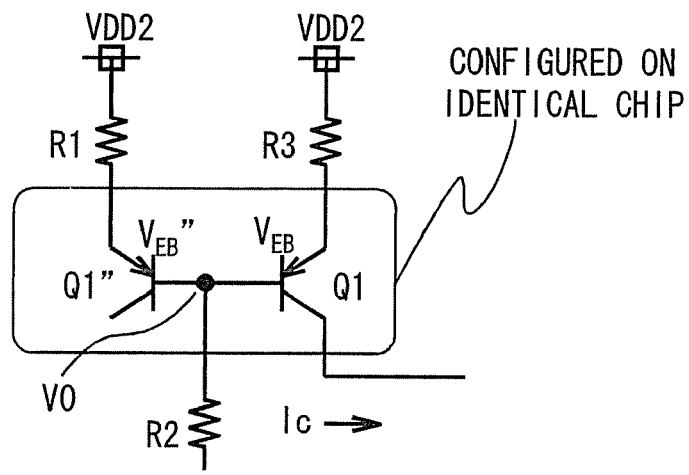
FIG. 20 shows an improved circuit example 2 for element variances according to Embodiment 3 of the invention.

Embodiment 3 suppresses the characteristic fluctuations of the transistor Q1 and the like semiconductor devices themselves constituting the constant-current-pulse gate drive circuit 21. For this purpose, as shown in FIGS. 19 and 20, the transistor Q1 and a constituent D1 (or Q1") being a compensating semiconductor device are configured under the same conditions within an identical IC chip.

The transistor Q1 and the diode D1 or the transistor Q1" are manufactured under the same conditions in the identical IC or chip, whereby the transistor Q1 exhibits a variance characteristic in which the variance direction of the voltage $V_{EB}$ agrees (when the voltage $V_{EB}$ increases, a voltage $V_F$" increases), and an individual difference variance can be compensated. Besides, temperature conditions agree, whereby a temperature compensation becomes possible, and a constant current characteristic can be improved against a temperature change.

Fourth Embodiment

Embodiment 4 permits the switching of the constant current output based on the constant-current-pulse gate drive circuit 2 in the foregoing embodiment 1, whereby a more excellent running characteristic can be obtained in accordance with a running condition.

In a case where a motor or the like is driven by the IGBT or the like switching device, a radiation noise level and losses are changed by switching in some running conditions. More specifically, when a switching speed is raised, the noise level becomes high, but the turn-ON loss and turn-OFF loss decrease. When the switching speed is lowered for a radio wave noise countermeasure, the turn-ON loss and the turn-OFF loss increase. That is, it can be said that the noise and the switching speed are in the relationship of trade-off.

With the fixed switching speed as in the prior art, however, it has been necessary to determine the switching speed under a running condition under which the noise is most liable to appear. That is, under the running condition under which the noise is most liable to appear, the switching speed must be lowered to a level at which an EMI (electromagnetic interference) is not problematic. In consequence, there have been the tendencies that the switching speed is unnecessarily limited, and that the losses are unnecessarily increased.

Figure 21:
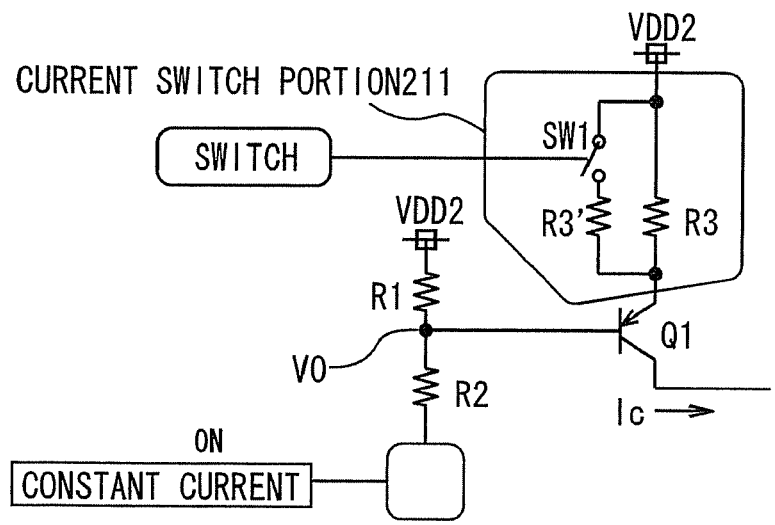
FIG. 21 is a circuit diagram of a current switch portion 211 according to Embodiment 4 of the invention.
Figure 22:
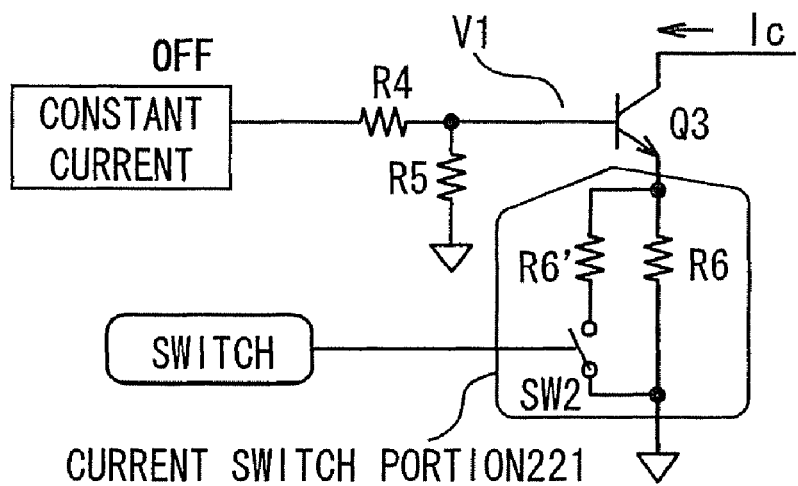
FIG. 22 is a circuit diagram of a current switch portion 221 according to Embodiment 4 of the invention.

FIGS. 21 and 22 show this embodiment 4. A configuration in FIG. 21 is such that the ON constant-current-pulse gate drive circuit 21-1 is provided with a current switch portion 211 in which at least one set consisting of a switch SW1 and a resistance R3' is mounted in parallel with a resistance R3 for setting a constant current, and which is a current switch circuit for performing the switching drive of a constant-current output value. An FET or a transistor, for example, is used as the switch SW1.

An OFF side is similarly configured, and a configuration in FIG. 22 is such that the OFF constant-current-pulse gate drive circuit 22-1 is provided with a current switch portion 221 in which at least one set consisting of a switch SW2 and a resistance R6' is mounted in parallel with a resistance R6 for setting a constant current, and which is a current switch circuit for performing the switching drive of a constant-current output value.

Figure 23:
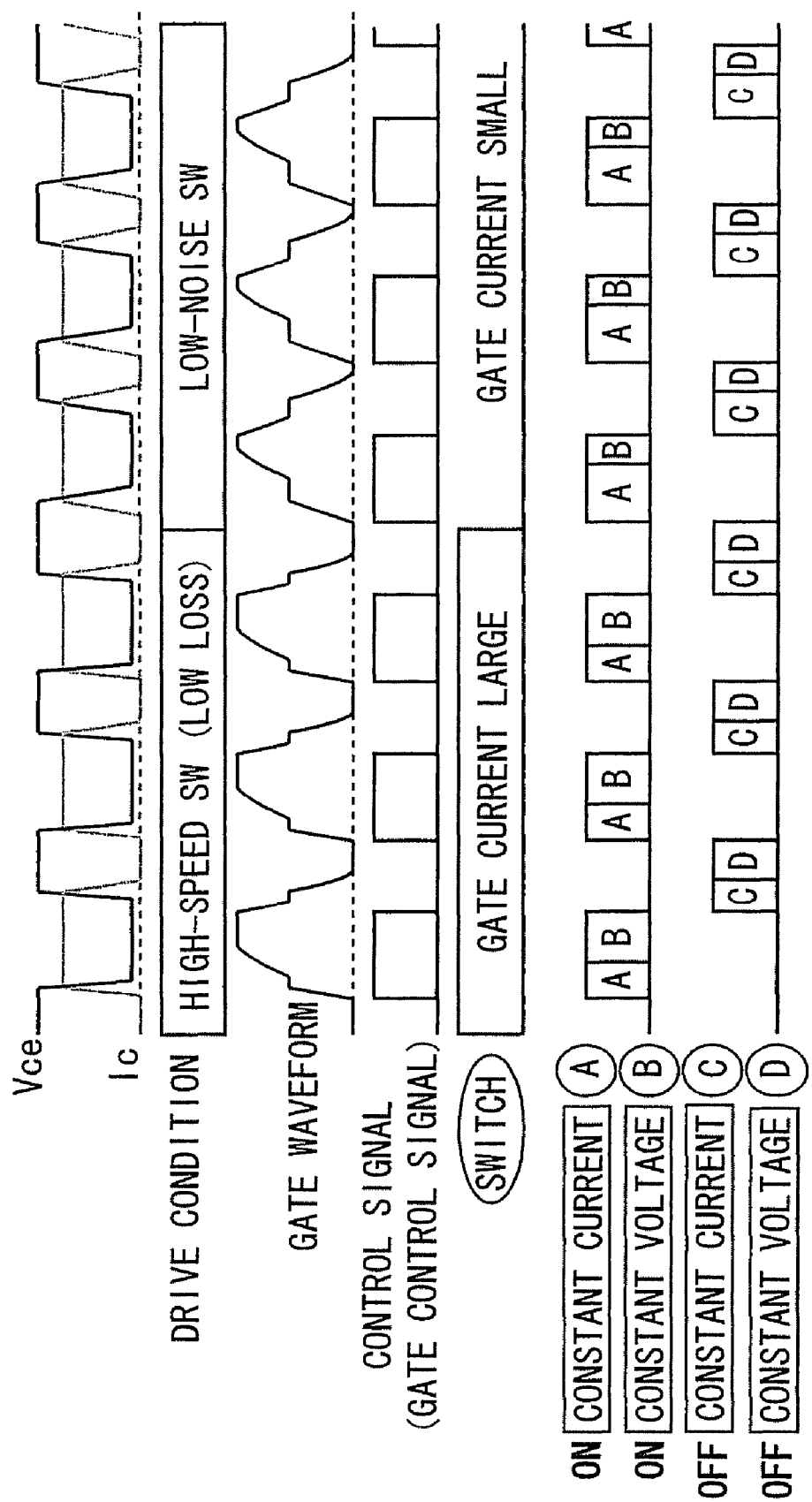
FIG. 23 is a waveform diagram for explaining an operation according to Embodiment 4 of the invention.

A drive timing chart in the case where the current switch portions 211 and 221 are mounted, is shown in FIG. 23.

In this embodiment 4, the switching speed is varied by the gate drive apparatus in which the switching speed based on the constant-current drive is stabilized, whereby the trade-off relationship of the noise and the switching losses can be dynamically controlled. Thus, it is permitted to control the switching speed in accordance with the running condition. Concretely, in the running region/condition where the radiation noise level ascribable to the switching noise becomes high, the switching speed is lowered to suppress the appearance of the noise. Besides, in the running region/condition where the radiation noise level ascribable to the switching noise becomes low, the switching speed is raised to decrease the losses.

In the case where the resistances are switched by applying the prior-art "constant voltage-resistance" drive scheme, the advantages might not be sufficiently attainable on account of the individual difference variance of the switching speeds. In contrast, according to the scheme revealed by this embodiment 4, the individual difference variance is eliminated, and hence, the advantages of the switch of the switching speeds based on the constant-current switch can be sufficiently attained.

Incidentally, although the case of the motor load has been described above, the scheme of Embodiment 4 is applicable, not only to the motor load, but also to an inductance or capacitive load and a resistance load, by switching the switching speeds between in a running condition in which the noise of the load is liable to appear and in a running condition in which the noise is less liable to appear.

Besides, although the example in which both the current switch portion 211 and the current switch portion 221 are included is illustrated in Embodiment 4, either of the current switch portions can be included.

Also, the configuration in FIG. 21 can be used as a configuration which completely cuts off unsupposed current supply ascribable to the delay of the current OFF operation based on the transistor Q1. The gist of this use will be explained below.

In this case, the constant-current-pulse gate drive circuit 2 has the constant current of the gate drive mode set by the resistance R3', and it is so operated that, at the timing of the stop of the constant current output, the switch SW1 is turned OFF, whereupon the resistance R3' determining the constant current is instantly switched to the resistance R3, whereby the current of the constant-current drive circuit attributed to the OFF delay thereof is prevented from influencing the gate circuit.

Concretely, at the same time as the stop timing of the constant current, the "switch" signal is turned OFF to turn OFF the switch SW1. In order to promptly return the suppressed current state into the state where the original drive current is obtained, after the lapse of a time period in which the OFF delay of the transistor Q1 is considered, the "switch" signal is turned ON to turn ON the switch SW1, in consideration of the OFF delay time. Thus, the OFF delay of the transistor Q1 can be improved.

On this occasion, $$R3 \gg R3'$$

is held, and the resistance R3 is set at a value which is much larger than the OFF resistance of the gate.

It is also possible to omit the resistance R3, but the OFF state of the transistor Q1 is more ensured by endowing the resistance R3 with the large value, and a stable initial state is given to a capacitance $C_{EB}$ being the feedback capacitance of the transistor Q1. Thus, a transient current characteristic is prevented from worsening due to the unstable charged state of the capacitance $C_{EB}$ of the transistor Q1, at a timing at which the gate is turned ON with the constant current next, and the high-speed constant current characteristic of the constant-current-pulse gate drive circuit 2 can be stabilized.

Fifth Embodiment

Meanwhile, there is sometimes adopted, for example, a configuration in which, in a case where an overcurrent has flowed through a switching device 1 in a turn-ON operation, the gate of the switching device 1 is forcibly shifted into OFF by a high-speed protection circuit disposed outside, before a control circuit gives the instruction of an emergency stop. On this occasion, constant-current drive is once switched to constant-voltage drive when the decision/switch circuit 4, etc. in each of the foregoing embodiments are used, but the voltage of the gate is sometimes lowered by the high-speed protection circuit or the like, so that the constant-current drive proceeds again. Moreover, the gate voltage rises again, depending upon the circuit constant of the high-speed protection circuit and the circuit constant of a constant-current-pulse gate drive circuit, and the function of the high-speed protection circuit might be hampered.

This embodiment 5 eliminates the above drawbacks, and it bestows so-called "hysteresis characteristics" on the first decision circuit 41 and the second decision circuit 42 which are used in the foregoing decision/switch circuit 4, etc.

Figure 24:
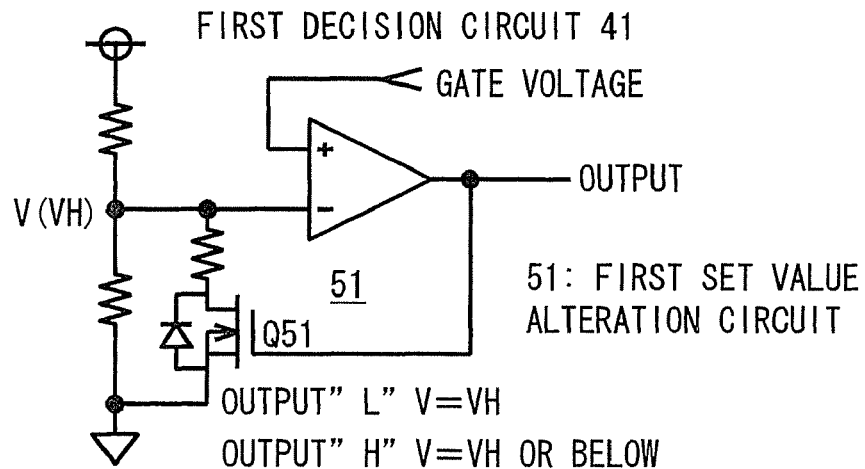
FIG. 24 is a circuit diagram of a first decision circuit 41 according to Embodiment 5 of the invention.

More specifically, FIG. 24 shows the first decision circuit 41 which is furnished with a first set value alteration circuit 51. When the gate voltage exceeds a first set value (VH: a value of or above the greatest variance value of a mirror voltage is set), and the output of a comparator rises from an "L" level to an "H" level, a constituent Q51 is turned ON, and the first set value is decreased a predetermined magnitude.

Figure 25:
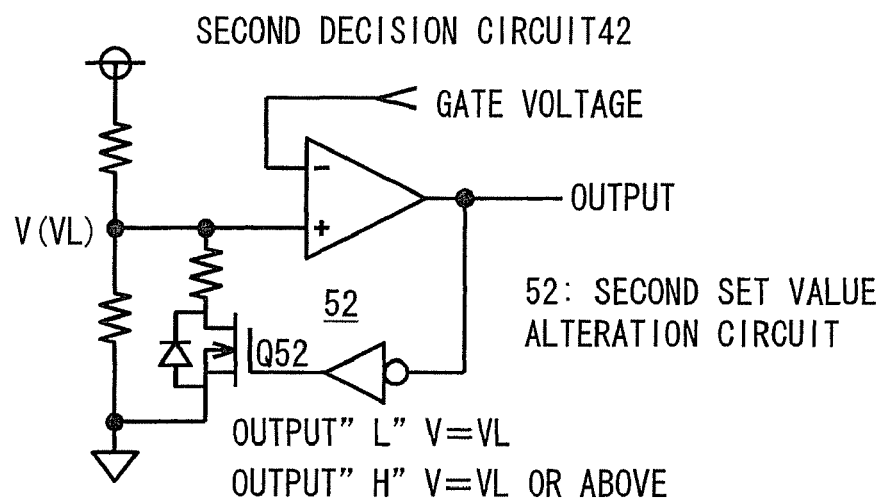
FIG. 25 is a circuit diagram of a second decision circuit 42 according to Embodiment 5 of the invention.

FIG. 25 shows the second decision circuit 42 which is furnished with a second set value alteration circuit 52. When the gate voltage becomes less than a second set value (VL: a value of or below the least threshold voltage Vth is set), and the output of a comparator rises from the "L" to the "H", a constituent Q52 is turned OFF, and the second set value is increased a predetermined magnitude.

Thus, regarding the gate voltage which is switched from a constant current to a constant voltage, it is possible to prevent the above problems at the time of switching the gate drive conditions, and abnormal constant-current drive and a low-voltage-drive switching variance ascribable to the fluctuations of the gate voltage near the VH decision voltage.

Sixth Embodiment

Figure 26:
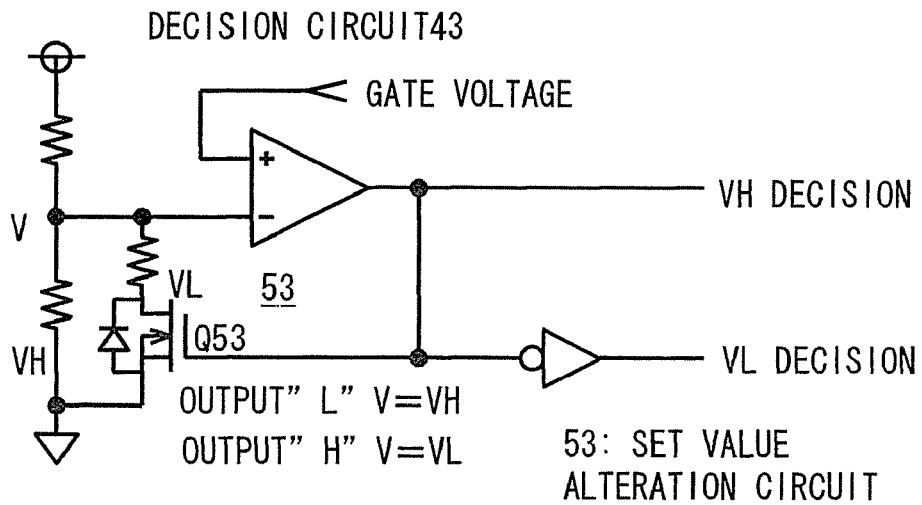
FIG. 26 is a circuit diagram of a decision circuit 43 according to Embodiment 6 of the invention.
Figure 27:
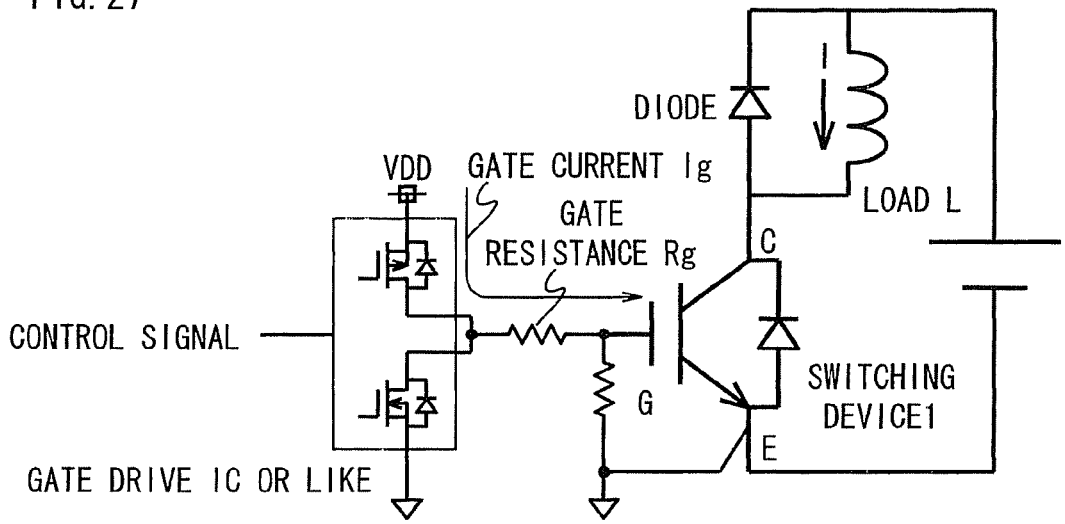
FIG. 27 is a circuit diagram showing an arrangement example of a prior-art gate drive circuit.
Figure 28:
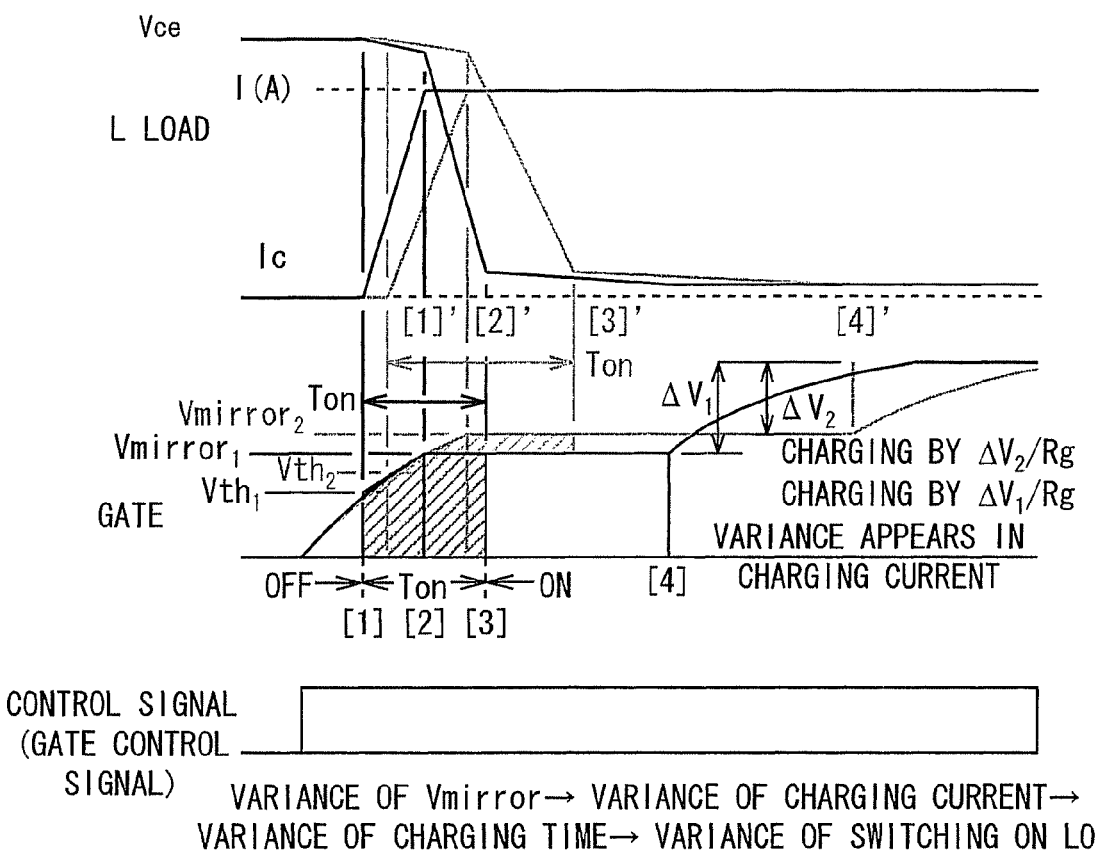
FIG. 28 is a waveform diagram showing the operating state of the prior-art gate drive circuit.

FIG. 26 shows a decision circuit 43 in Embodiment 6, in which a set value alteration circuit 53 is disposed. The upper limit value of the hysteresis characteristics in the preceding embodiment 5 is set at the value VH (the value of or above the greatest variance value of the mirror voltage), and the lower limit value at the value VL (the value of or below the least threshold voltage Vth), whereby a VH decision and a VL decision are outputted by the single decision circuit 43.

More specifically, when the gate voltage exceeds the value VH in the turn-ON operation, the output of a comparator rises from the "L" to the "H" to output the VH decision, whereby the constant-current drive is switched to the constant-voltage drive. At the same time, a constituent Q53 is turned ON to alter the set value to the value VL. When the gate voltage becomes less than the value VL in the turn-OFF operation, the output of the comparator lowers from the "H" to the "L" to output the VL decision, whereby the constant-current drive is switched to the constant-voltage drive. At the same time, the constituent Q53 is turned OFF to alter the set value to the value VH.

Thus, the operation can be limited to one time of constant-current drive per gate drive pulse, the malfunction in which the current is supplied from the constant-current-pulse gate drive circuit again is preventable when the gate voltage lowers due to the operation of the external gate voltage limitation circuit in an arm short-circuit or overload protection operation.

Moreover, the two required comparison circuits (refer to FIG. 5) in Embodiment 1 can be decreased to the single circuit.

Incidentally, in the above example, the operation of the comparator has been described as the active H for the brevity of the description of the circuit, the same advantages can, of course, be attained by setting the output of the comparator as active L and revising the succeeding logic circuits.

Regarding a design as the active L, in a case, for example, where a general-purpose analog comparator IC is used, output terminals are of open-collector type in many of analog comparator ICs. In some examples, therefore, the shift of the output signal becomes faster in the active L than in the active H. In such a case, the delay of the operation is prevented by selecting the active L operation and designing the active L scheme.

Various modifications and alterations of this invention will be apparent to those skilled in the art without departing from the scope and spirit of this invention, and it should be understood that this is not limited to the illustrative embodiments set forth herein.

What is claimed is:

1. A gate drive apparatus which is connected to a gate of a switching device of voltage drive type, and which outputs, to the gate, gate signals that at least one of turn ON and OFF the switching device on the basis of at least one of ON and OFF gate control signals, respectively, wherein the gate drive apparatus is configured for either or both of the turn-ON operation and the turn-OFF operation, and the gate drive apparatus comprises:

a constant-current-pulse gate drive circuit which creates the gate signal as a constant-current output;

a constant-voltage-pulse gate drive circuit which creates the gate signal as a constant-voltage output; and a decision switch circuit which switches between the operation of said constant-current-pulse gate drive circuit and the operation of said constant-voltage-pulse gate drive circuit.

2. A gate drive apparatus as defined in claim 1, wherein said decision switch circuit comprises:
a gate voltage detection circuit which detects the voltage of the gate;
a first decision circuit which decides magnitudes of the gate voltage and a predetermined first set value;
a second decision circuit which decides magnitudes of the gate voltage and a predetermined second set value; and
a switch circuit which, in the turn-ON operation, first connects said constant-current-pulse gate drive circuit to the gate and subsequently connects said constant-voltage-pulse gate drive circuit to the gate instead of said constant-current-pulse gate drive circuit when said first decision circuit decides that the gate voltage exceeds the first set value, and which, in the turn-OFF operation, first connects said constant-current-pulse gate drive circuit to the gate and subsequently connects said constant-voltage-pulse gate drive circuit to the gate instead of said constant-current-pulse gate drive circuit when said second decision circuit decides that the gate voltage is less than the second set value.

3. A gate drive apparatus as defined in claim 2, further comprising:
a first set value alteration circuit which, in the turn-ON operation, alters the first set value of said first decision circuit to a set value decreased a predetermined magnitude, when said first decision circuit decides that the gate voltage exceeds the first set value; and
a second set value alteration circuit which, in the turn-OFF operation, alters the second set value of said second decision circuit to a set value increased a predetermined magnitude, when said second decision circuit decides that the gate voltage is less than the second set value.

4. A gate drive apparatus as defined in claim 1, wherein said decision switch circuit comprises
a gate voltage detection circuit which detects the voltage of the gate;
a decision circuit which decides magnitudes of the gate voltage and a predetermined first set value;
a set value alteration circuit which, in the turn-ON operation, alters the first set value of said decision circuit to a predetermined second set value when said decision circuit decides that the gate voltage exceeds the first set value; and
a switch circuit which, in the turn-ON operation, first connects said constant-current-pulse gate drive circuit to the gate and subsequently connects said constant-voltage-pulse gate drive circuit to the gate instead of said constant-current-pulse gate drive circuit when said decision circuit decides that the gate voltage exceeds the first set value, and which, in the turn-OFF operation, first connects said constant-current-pulse gate drive circuit to the gate and subsequently connects said constant-voltage-pulse gate drive circuit to the gate instead of said constant-current-pulse gate drive circuit when said decision circuit decides that the gate voltage is less than the second set value.

5. A gate drive apparatus as defined in claim 2, wherein:
in a case where a plurality of such switching devices are driven by the gate drive apparatus, and where a mirror voltage and a gate threshold value of each of the switching devices have variances from greatest values to least values, respectively;
the first set value is set at a value which is, at least, the greatest value of the mirror voltage, and the second set value is set at a value which is, at most, the least value of the gate threshold voltage.

6. A gate drive apparatus as defined in claim 1, wherein a voltage of a control power source of said constant-current-pulse gate drive circuit is set to be higher than a voltage of a control power source of said constant-voltage-pulse gate drive circuit.

7. A gate drive apparatus as defined in claim 6, further comprising a voltage limitation circuit which is inserted between said constant-current-pulse gate drive circuit and the gate of the switching device, and which limits the gate voltage to, at most, a predetermined voltage value.

8. A gate drive apparatus as defined in claim 1, comprising:
a compensating semiconductor device comprised on a chip identical to that of a semiconductor device constituting said constant-current-pulse gate drive circuit, the compensating semiconductor device being connected to the first-mentioned semiconductor device to suppress a fluctuation of the constant-current output of said constant-current-pulse gate drive circuit during a temperature change.

9. A gate drive apparatus as defined in claim 1, wherein said constant-current-pulse gate drive circuit includes a current switch circuit which switches values of the constant-current output thereof.

10. A gate drive apparatus as defined in claim 3, wherein:
in a case where a plurality of such switching devices are driven by the gate drive apparatus, and where a mirror voltage and a gate threshold value of each of the switching devices have variances from greatest values to least values, respectively;
the first set value is set at a value which is, at least, the greatest value of the mirror voltage, and the second set value is set at a value which is, at most, the least value of the gate threshold voltage.

11. A gate drive apparatus as defined in claim 4, wherein:
in a case where a plurality of such switching devices are driven by the gate drive apparatus, and where a mirror voltage and a gate threshold value of each of the switching devices have variances from greatest values to least values, respectively;
the first set value is set at a value which is, at least, the greatest value of the mirror voltage, and the second set value is set at a value which is, at most, the least value of the gate threshold voltage.

12. A gate drive apparatus as defined in claim 3, wherein a voltage of a control power source of said constant-current-pulse gate drive circuit is set to be higher than a voltage of a control power source of said constant-voltage-pulse gate drive circuit.

13. A gate drive apparatus as defined in claim 4, wherein a voltage of a control power source of said constant-current-pulse gate drive circuit is set to be higher than a voltage of a control power source of said constant-voltage-pulse gate drive circuit.

14. A gate drive apparatus as defined in claim 12, further comprising a voltage limitation circuit which is inserted between said constant-current-pulse gate drive circuit and the gate of the switching device, and which limits the gate voltage to, at most, a predetermined voltage value.

15. A gate drive apparatus as defined in claim 13, further comprising a voltage limitation circuit which is inserted between said constant-current-pulse gate drive circuit and the gate of the switching device, and which limits the gate voltage to, at most, a predetermined voltage value.

16. A gate drive apparatus as defined in claim 2, comprising:
- a compensating semiconductor device comprised on a chip identical to that of a semiconductor device constituting said constant-current-pulse gate drive circuit, the compensating semiconductor device being connected to the first-mentioned semiconductor device to suppress a fluctuation of the constant-current output of said constant-current-pulse gate drive circuit during a temperature change.

17. A gate drive apparatus as defined in claim 4, comprising:
- a compensating semiconductor device comprised on a chip identical to that of a semiconductor device constituting said constant-current-pulse gate drive circuit, the compensating semiconductor device being connected to the first-mentioned semiconductor device to suppress a fluctuation of the constant-current output of said constant-current-pulse gate drive circuit during a temperature change.

18. A gate drive apparatus as defined in claim 2, wherein said constant-current-pulse gate drive circuit includes a current switch circuit which switches values of the constant-current output thereof.

19. A gate drive apparatus as defined in claim 4, wherein said constant-current-pulse gate drive circuit includes a current switch circuit which switches values of the constant-current output thereof.

20. A gate drive apparatus as defined in claim 1, wherein said decision switch circuit switches between the operation of said constant-current-pulse gate drive circuit and the operation of said constant-voltage-pulse gate drive circuit such that said constant-voltage-pulse gate drive circuit and said constant-current-pulse gate drive circuit are operated alternately in succession.

* * * * *